(12) United States Patent
Watanabe et al.

(10) Patent No.: US 10,903,376 B2
(45) Date of Patent: Jan. 26, 2021

(54) LIGHT RECEIVING/EMITTING ELEMENT, SOLAR CELL, OPTICAL SENSOR, LIGHT EMITTING DIODE, AND SURFACE EMITTING LASER ELEMENT

(71) Applicants: Sony Corporation, Tokyo (JP); SUZHOU INSTITUTE OF NANO-TECH AND NANO-BIONICS, CHINESE ACADEMY OF SCIENCES, Suzhou (CN)

(72) Inventors: Tomomasa Watanabe, Kanagawa (JP); Hiroshi Yoshida, Kanagawa (JP); Masao Ikeda, Kanagawa (JP); Shiro Uchida, Tokyo (JP); Ichiro Nomachi, Kanagawa (JP); Masayuki Arimochi, Kanagawa (JP); Hui Yang, Suzhou (CN); Shulong Lu, Suzhou (CN); Xinhe Zheng, Suzhou (CN)

(73) Assignees: Sony Corporation, Tokyo (JP); Suzhou Institute of Nano-Tech and Nano-Bionics, Suzhou (CN)

( * ) Notice: Subject to any disclaimer, the term of this patent is extended or adjusted under 35 U.S.C. 154(b) by 92 days.

(21) Appl. No.: 16/102,115

(22) Filed: Aug. 13, 2018

(65) Prior Publication Data

US 2018/0374970 A1    Dec. 27, 2018

Related U.S. Application Data

(62) Division of application No. 14/419,355, filed as application No. PCT/JP2013/065471 on Jun. 4, 2013, now abandoned.

(30) Foreign Application Priority Data

Aug. 9, 2012    (CN) .......................... 2012 1 0281451

(51) Int. Cl.
*H01L 31/0224*    (2006.01)
*H01L 33/42*    (2010.01)
(Continued)

(52) U.S. Cl.
CPC ............... *H01L 31/022475* (2013.01); *H01L 31/022408* (2013.01); *H01L 31/022425* (2013.01);
(Continued)

(58) Field of Classification Search
None
See application file for complete search history.

(56) References Cited

U.S. PATENT DOCUMENTS 4,649,088 A    3/1987    Mitsui et al.
4,694,117 A    9/1987    Friedrich et al.
(Continued)

FOREIGN PATENT DOCUMENTS

EP    1 965 442    9/2008
EP    2669952 A1 *  12/2013    ......... H01L 31/1884
(Continued)

OTHER PUBLICATIONS

International Search Report issued in connection with International Patent Application No. PCT/JP2013/065471, dated Jul. 16, 2013. (2 pages).

(Continued)

*Primary Examiner* — Devina Pillay
(74) *Attorney, Agent, or Firm* — K&L Gates LLP

(57) ABSTRACT

A light receiving/emitting element 11 includes: a light receiving/emitting layer 21 in which a plurality of compound semiconductor layers are stacked; and an electrode 30 having a first surface 30A and a second surface 30B and made of a transparent conductive material, in which the second surface faces the first surface 30A, and the electrode (Continued)

is in contact, at the first surface 30A, with the light receiving/emitting layer 21. The transparent conductive material contains an additive made of one or more metals, or a compound thereof, selected from the group consisting of molybdenum, tungsten, chromium, ruthenium, titanium, nickel, zinc, iron, and copper, and concentration of the additive contained in the transparent conductive material near an interface to the first surface 30A of the electrode 30 is higher than concentration of the additive contained in the transparent conductive material near the second surface 30B of the electrode 30.

5 Claims, 10 Drawing Sheets

(51) Int. Cl.
| | | |
|---|---|---|
| *H01L 33/32* | (2010.01) | |
| *H01L 31/0693* | (2012.01) | |
| *H01L 31/18* | (2006.01) | |
| *H01S 5/042* | (2006.01) | |
| *H01L 31/0304* | (2006.01) | |
| *H01L 33/00* | (2010.01) | |
| *H01L 33/30* | (2010.01) | |
| *H01L 33/38* | (2010.01) | |
| *H01S 5/18* | (2006.01) | |
| *H01S 5/343* | (2006.01) | |
| *H01S 5/183* | (2006.01) | |

(52) U.S. Cl.
CPC ............ *H01L 31/022466* (2013.01); *H01L 31/022483* (2013.01); *H01L 31/0304* (2013.01); *H01L 31/03044* (2013.01); *H01L 31/03046* (2013.01); *H01L 31/03048* (2013.01); *H01L 31/0693* (2013.01); *H01L 31/1844* (2013.01); *H01L 31/1884* (2013.01); *H01L 33/0025* (2013.01); *H01L 33/30* (2013.01); *H01L 33/32* (2013.01); *H01L 33/38* (2013.01); *H01L 33/42* (2013.01); *H01S 5/04253* (2019.08); *H01S 5/04254* (2019.08); *H01S 5/18* (2013.01); *H01S 5/34313* (2013.01); *H01S 5/183* (2013.01); *H01S 5/34333* (2013.01); *Y02E 10/544* (2013.01)

(56) References Cited

U.S. PATENT DOCUMENTS

| | | | |
|---|---|---|---|
| 2005/0104080 A1* | 5/2005 | Ichihara | H01L 33/32 |
| | | | 257/98 |
| 2005/0230701 A1 | 10/2005 | Huang | |
| 2006/0091405 A1 | 5/2006 | Kwak | |
| 2007/0028959 A1 | 2/2007 | Lee | |
| 2010/0218819 A1* | 9/2010 | Farmer | H01L 31/02167 |
| | | | 136/256 |
| 2010/0258769 A1 | 10/2010 | Krietsch | |
| 2011/0036399 A1 | 2/2011 | Lin | |
| 2011/0092011 A1* | 4/2011 | Yun | G02B 1/118 |
| | | | 438/85 |
| 2011/0195196 A1 | 8/2011 | Kim | |
| 2012/0015147 A1 | 1/2012 | Maa | |
| 2012/0103669 A1* | 5/2012 | Pruneri | H01L 31/022425 |
| | | | 174/257 |
| 2012/0125417 A1* | 5/2012 | Walukiewicz | H01L 31/03048 |
| | | | 136/255 |
| 2013/0092230 A1 | 4/2013 | Pereira | |
| 2013/0182328 A1* | 7/2013 | Stewart | G02B 1/118 |
| | | | 359/580 |

FOREIGN PATENT DOCUMENTS

| | | |
|---|---|---|
| JP | 60-208813 | 10/1985 |
| JP | 61-260684 | 11/1986 |
| JP | 05-110125 | 4/1993 |
| JP | 2002-217428 | 8/2002 |
| JP | 2002-256423 | 9/2002 |
| JP | 2006-128631 | 5/2006 |
| JP | 2008-124381 | 5/2008 |
| JP | 2008235877 | 10/2008 |
| JP | 2011-049453 | 3/2011 |
| JP | 2011-201301 | 10/2011 |
| KR | 10-2011-0095114 | 8/2011 |
| WO | 2007069651 | 6/2007 |
| WO | 2012059862 | 5/2012 |

OTHER PUBLICATIONS

Chinese Office Action dated Jun. 6, 2016 in corresponding Chinese application No. 201210281451.8 (21 pages).
Japanese Office Action dated Nov. 22, 2016 in corresponding Japanese Application No. 2014-529337.
Japanese Office Action dated Jul. 4, 2017 in corresponding Japanese Application No. 2014529337.

* cited by examiner

LIGHT RECEIVING/EMITTING ELEMENT, SOLAR CELL, OPTICAL SENSOR, LIGHT EMITTING DIODE, AND SURFACE EMITTING LASER ELEMENT

CROSS REFERENCES TO RELATED APPLICATIONS

The present application is a divisional application of U.S. patent application Ser. No. 14/419,355, filed on Feb. 3, 2015, which application is a national stage of International Application No. PCT/JP2013/065471 filed on Jun. 4, 2013 and claims priority to Chinese Patent Application No. 201210281451.8 filed on Aug. 9, 2012, the disclosure of which is incorporated herein by reference.

BACKGROUND

The disclosure relates to a light receiving/emitting element, a solar cell, an optical sensor, a light emitting diode, and a surface emitting laser element. More specifically, the disclosure relates to a light receiving/emitting element, a solar cell, an optical sensor, a light emitting diode, and a surface emitting laser element, each characterized by an electrode.

SUMMARY

A transparent conductive film having high conductivity and high transmittance in a visible light range is used for an electrode of a solar cell, a light receiving element, or the like. In addition, a sintered compact target used to form such a transparent conductive film on the basis of a sputtering method is known from Japanese Unexamined Patent Application Publication No. 2002-256423, for example. The sintered compact target for fabrication of the transparent conductive film is characterized by containing indium, molybdenum, and oxygen where molybdenum is present in the proportion of 0.003 to 0.20 in terms of atomic ratio to indium, and in that a relative density of the sintered compact is 90% or greater.

Also, a laminator is known from Japanese Unexamined Patent Application Publication No. 2011-201301 that includes a buffer layer on a base, and a transparent conductive film layer formed on the buffer layer. The buffer layer is configured of one or more selected from: a gallium oxide thin film; an oxide thin film made of gallium, indium, and oxygen; and an oxide thin film made of gallium, indium, aluminum, and oxygen. The transparent conductive film layer is configured of an oxide thin film that contains titanium oxide as a main component and includes one or more elements selected from niobium, tantalum, molybdenum, arsenic, antimony, and tungsten.

PRIOR ART DOCUMENT

Patent Document

Patent Document 1: Japanese Unexamined Patent Application Publication No. 2002-256423
Patent Document 2: Japanese Unexamined Patent Application Publication No. 2011-201301

Incidentally, for example, when the content of molybdenum is high in the transparent conductive film and the transparent conductive film layer disclosed in the Patent Documents described above, low contact resistance is obtained. However, this raises an issue of a decrease in light transmittance.

An object of the disclosure is therefore to provide a light receiving/emitting element, a solar cell, an optical sensor, a light emitting diode, and a surface emitting laser element, each including an electrode having low contact resistance and high light transmittance.

Solution to Problem

To achieve the above-described object, a light receiving/emitting element according to the disclosure includes:
a light receiving/emitting layer in which a plurality of compound semiconductor layers are stacked; and
an electrode having a first surface and a second surface and made of a transparent conductive material, in which the second surface faces the first surface, and the electrode is in contact, at the first surface, with the light receiving/emitting layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

To achieve the above-described object, a solar cell or an optical sensor according to the disclosure includes:
a light receiving layer in which a plurality of compound semiconductor layers are stacked; and
an electrode having a first surface and a second surface and made of a transparent conductive material, in which the second surface faces the first surface, and the electrode is in contact, at the first surface, with the light receiving layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

To achieve the above-described object, a light emitting diode or a surface emitting laser element according to the disclosure includes:
a light emitting layer in which a plurality of compound semiconductor layers are stacked; and
an electrode having a first surface and a second surface and made of a transparent conductive material, in which the second surface faces the first surface, and the electrode is in contact, at the first surface, with the light emitting layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

Effect of the Invention

In the light receiving/emitting element, the solar cell, the optical sensor, the light emitting diode, and the surface emitting laser element according to the disclosure, the transparent conductive material contains the additive. Further, the concentration of the additive contained in the transparent conductive material near the interface to the first surface of the electrode is higher than the concentration of the additive contained in the transparent conductive material near the second surface of the electrode. Hence, it is possible to provide the electrode that satisfies both low contact resistance and high light transmittance.

Additional features and advantages are described herein, and will be apparent from the following Detailed Description and the figures.

DETAILED DESCRIPTION

Figure 1A:
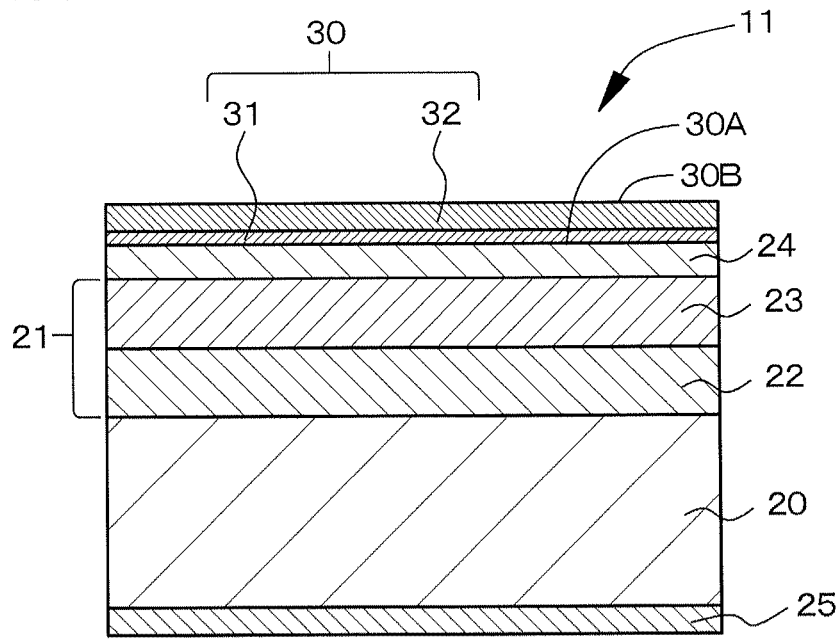
FIGS. 1A and 1B are each a schematic cross-sectional view of a light receiving/emitting element, a solar cell, and an optical sensor in Example 1 or 2.

Embodiments of the present application will be described below in detail with reference to the drawings.

In the following, a description is given of the disclosure on the basis of Examples, while referring to the drawings. Note, however, that the disclosure is not limited to the Examples, and various numerical values and materials in the Examples are exemplary only. The description is given in the order as follows.

1. General Description related to a light receiving/emitting element, a solar cell, an optical sensor, a light emitting diode, and a surface emitting laser element according to the disclosure 2. Example 1 (the light receiving/emitting element, the solar cell, and the optical sensor according to the disclosure)

3. Example 2 (a modification of the Example 1)

4. Example 3 (a modification of the Example 2)

5. Example 4 (the light emitting diode and the surface emitting laser element according to the disclosure)

6. Example 5 (modifications of Examples 1 to 4), etc.

[General Description Related to Light Receiving/Emitting Element, Solar Cell, Optical Sensor, Light Emitting Diode, and Surface Emitting Laser Element According to the Disclosure]

In a light receiving/emitting element, a solar cell, an optical sensor, a light emitting diode, and a surface emitting laser element according to the disclosure (in the following, may be collectively and simply referred to as "light receiving/emitting element, etc., of the disclosure"), a compound semiconductor configuring compound semiconductor layers may be, for example: a GaAs-based compound semiconductor including binary mixed crystal, ternary mixed crystal, or quaternary mixed crystal; a GaP-based compound semiconductor including binary mixed crystal, ternary mixed crystal, or quaternary mixed crystal; a GaInP-based compound semiconductor including ternary mixed crystal or quaternary mixed crystal; an InP-based compound semiconductor including binary mixed crystal, ternary mixed crystal, or quaternary mixed crystal; or a GaN-based compound semiconductor including binary mixed crystal, ternary mixed crystal, or quaternary mixed crystal.

In the light receiving/emitting element, etc., of the disclosure, including the preferred embodiment described above, a transparent conductive material may be, for example, ITO (indium tin composite oxide, Indium Tin Oxide, or Sn-doped $In_2O_3$, including crystalline ITO and amorphous ITO), IZO (indium zinc composite oxide or Indium Zinc Oxide), AZO (aluminum-oxide-doped zinc oxide), GZO (gallium-doped zinc oxide), AlMgZnO (aluminum-oxide-and-magnesium-oxide-doped zinc oxide), indium gallium composite oxide (IGO), In—$GaZnO_4$ (IGZO), IFO (F-doped $In_2O_3$), antimony-doped $SnO_2$ (ATO), FTO (F-doped $SnO_2$), tin oxide ($SnO_2$), zinc oxide (ZnO), B-doped ZnO, InSnZnO, or ITiO (Ti-doped $In_2O_3$).

In the light receiving/emitting element of the disclosure, including the various preferred embodiments described above, a configuration may be employed in which auxiliary electrodes are formed on a second surface of an electrode. A planar shape of the auxiliary electrode may be, for example, a grid-like shape (a parallel-cross-like shape), or a shape in which a plurality of branch auxiliary electrodes extend parallel to one another and one ends or both ends of the respective branch electrodes are connected to one another. In addition, such a configuration may be a configuration in which a contact layer is formed between a light receiving/emitting layer and the second surface of the electrode, and in which the contact layer is configured of a compound semiconductor same as a compound semiconductor that configures one or more layers in a plurality of compound semiconductor layers configuring the light receiving/emitting layer. Here, a thickness of the contact layer may be from 3 nm to 30 nm where band gap energy of a material configuring the contact layer is smaller than band gap energy of the light receiving layer or the light emitting layer, for example. Note that the thickness of the contact layer is not limited to the range ranging from 3 nm to 30 nm when the band gap energy of the contact layer is larger than the band gap energy of the light receiving layer or the light emitting layer. Also, carrier concentration of the contact layer may be preferably $1\times10^{19}$ cm$^{-3}$ or greater. Note that the light receiving/emitting layer may have, without limitation, a configuration that has a stacked structure including an n-type compound semiconductor layer and a p-type compound semiconductor layer from the contact layer side, and in which the contact layer is made of GaAs, GaInP, GaP, InP, InGaAs, InGaAsP, GaN, or InGaN. Note that any of these materials configuring the contact layer may be of an n-type or of a p-type. Configuring the contact layer by n$^+$-type GaAs or n$^+$-type GaInP makes it difficult for a surface barrier layer to be oxidized upon formation of the electrode when the surface barrier layer made of n-AlInP is formed below the contact layer. An impurity contained in the contact layer made of n$^+$-type GaAs or n$^+$-type GaInP may be, for example, tellurium (Te). The carrier concentration of the contact layer may be measured based on a method such as a measurement that uses SIMS (secondary ion mass spectrometry), a Hall measurement, and a C-V measurement.

In the light receiving/emitting element of the disclosure, including the preferred embodiments and configurations described above, or the solar cell, the optical sensor, the light emitting diode, and the surface emitting laser element of the disclosure, including the preferred embodiments described above, a configuration may be employed in which:

the electrode has a stacked structure including a first layer and a second layer from the light receiving/emitting layer side, from the light receiving layer side, or from the light emitting layer side;

an additive is contained in a transparent conductive material configuring the first layer; and no additive is contained in a transparent conductive material configuring the second layer. Note that, for the sake of convenience, the light receiving/emitting element, the solar cell, the optical sensor, the light emitting diode, or the surface emitting laser element of the disclosure having such a configuration is referred to as "light receiving/emitting element, etc., of the disclosure having the first configuration"). It is preferable that the following be satisfied:

$$5 \leq Ic_1/Ic_2 \leq 10$$

where mean concentration of the additive contained in the transparent conductive material configuring the first layer is $Ic_1$, and mean concentration of the additive contained in the transparent conductive material configuring the second layer is $Ic_2$. Whether or not the additive is contained in the transparent conductive material may be evaluated using SIMS. Here, it may be determined that the additive is contained in the transparent conductive material when the carrier concentration of one kind of metal (specific example of which may be molybdenum) is $1.8\times10^{16}$ cm$^{-3}$ or greater. On the other hand, it may be determined that the additive is not contained in the transparent conductive material when the carrier concentration of one kind of metal (specific example of which may be molybdenum) is less than $1.8\times10^{16}$ cm$^{-3}$.

In addition, in the light receiving/emitting element, etc., of the disclosure having the first configuration, the mean concentration of the additive contained in the transparent conductive material configuring the first layer may be preferably from $5\times10^{16}$ cm$^{-3}$ to $1\times10^{18}$ cm$^{-3}$. In the light receiving/emitting element, etc., of the disclosure having the first configuration, including such a preferred configuration, it is preferable that the following be satisfied:

$$0.4 \leq R_2/R_1 \leq 1.0$$

$$0.80 \leq TP_2 \times TP_1 \leq 1.0$$

where electrical resistivity of the first layer is $R_1$, electrical resistivity of the second layer is $R_2$, and light transmittance of the first layer and light transmittance of the second layer are $TP_1$ and $TP_2$, respectively, where a wavelength ranges from 400 nm to 900 nm in a GaAs solar cell, for example. Further, in the light receiving/emitting element, etc., of the disclosure having the first configuration, including such preferred configurations, it is preferable that mean light transmittance of the electrode be 95% or greater, mean electrical resistivity of the electrode be $2\times10^{-6}$ Ω·m ($2\times10^{-4}$ Ω·cm) or less, and contact resistance between the electrode and the light receiving/emitting layer (or the light receiving layer or the light emitting layer) be $1\times10^{-8}$ Ω·m$^2$ ($1\times10^{-4}$ Ω·cm$^2$) or less especially in a concentrating solar cell. Note that the contact resistance between the electrode and the light receiving/emitting layer (or the light receiving layer or the light emitting layer) in a non-concentrating solar cell may be preferably $1\times10^{-7}$ Ω·m$^2$ ($1\times10^{-3}$ Ω·cm$^2$) or less. Also, it is preferable that the following be satisfied:

$$2 \leq T_2/T_1 \leq 70$$

where a thickness of the first layer is $T_1$ and a thickness of the second layer is $T_2$, and in this case, it is more preferable that the following be satisfied:

$$3 \leq T_1 \text{ (nm)} \leq 60; \text{ and}$$

$$10 \leq T_2 \text{ (nm)} \leq 350.$$

Here, the mean concentration of the additive contained in the transparent conductive material configuring the first layer may be measured using SIMS. Also, the electrical resistivity of the first layer, the electrical resistivity of the second layer, and the mean electrical resistivity of the electrode may be measured based on an example method in which a surface of a solar cell is bonded to a support substrate such as a glass substrate and a back surface of the solar cell is peeled off followed by measurement of a remaining electrode layer using Hall measuring apparatus or a sheet resistance measuring apparatus. The contact resistance between the electrode and the light receiving/emitting layer (or the light receiving layer or the light emitting layer) may be measured based on a four-terminal measurement method after: remaining only the contact layer (configured of a n-GaAs compound semiconductor layer, for example) upon peeling off of the back surface of the solar cell following bonding of the surface of the solar cell to the support substrate such as the glass substrate; and forming a TLM pattern thereafter. Further, the light transmittance (light absorptance) of the first layer, the light transmittance (light absorptance) of the second layer, and the mean light transmittance (light absorptance) of the electrode may be measured using a transmittance-reflectance measuring apparatus through bonding to a glass substrate. Also, the thickness of the first layer and the thickness of the second layer may be measured based on a profilometer, or SEM electron microscope observation or TEM electron microscope observation.

Alternatively, in the light receiving/emitting element of the disclosure, including the preferred embodiments and configurations described above, or the solar cell, the optical sensor, the light emitting diode, and the surface emitting laser element of the disclosure, including the preferred embodiments described above, a configuration may be employed in which concentration of the additive contained in the transparent conductive material configuring the electrode may decrease gradually from the first surface to the second surface of the electrode. Note that, for the sake of convenience, the light receiving/emitting element, the solar cell, the optical sensor, the light emitting diode, or the surface emitting laser element of the disclosure having such a configuration is referred to as "light receiving/emitting element, etc., of the disclosure having the second configuration". The concentration of the additive contained in the transparent conductive material may be measured using SIMS.

In the solar cell of the disclosure, including the various preferred embodiments described above, a configuration may be employed in which:
the auxiliary electrodes are formed on the second surface of the electrode;
the contact layer is formed between the light-receiving layer and the first surface of the electrode; and
a reflection prevention film is formed on the exposed second surface of the electrode. As to the contact layer, various definitions and conditions described previously for the light receiving/emitting element may be applied. As a material configuring the reflection prevention film, a material smaller in refractive index than a compound semiconductor configuring the uppermost compound semiconductor layer may be preferably used, specific examples of which may include a layer made of $TiO_2$, $Al_2O_3$, ZnS, $MgF_2$, $Ta_2O_5$, $SiO_2$, or $Si_3N_4$ and a stacked structure having those layers, and formation thereof may be performed based on a physical vapor deposition method (PVD method) such as a sputtering method, for example. In addition, the solar cell having such a configuration may have, more specifically, a configuration in which a width of a portion of the second surface of the electrode, exposed between the auxiliary electrodes, is from 145 µm to 285 µm, a thickness of the electrode is from 10 nm to 30 nm, and the reflection prevention film has a stacked structure including a zinc sulfide layer having a thickness from 17 nm to 36 nm and a magnesium fluoride layer having a thickness from 85 nm to 93 nm. Alternatively, a configuration may be employed in which the width of the portion of the second surface of the electrode, exposed between the auxiliary electrodes, is from 145 µm to 285 µm, the thickness of the electrode is from 10 nm to 30 nm, and the reflection prevention film has a stacked structure including a tantalum oxide layer having a thickness from 18 nm to 32 nm and a silicon oxide layer having a thickness from 71 nm to 76 nm. Alternatively, a configuration may be employed in which the width of the portion of the second surface of the electrode, exposed between the auxiliary electrodes, is from 145 µm to 285 µm, the thickness of the electrode is from 10 nm to 25 nm, and the reflection prevention film has a stacked structure including a titanium oxide layer having a thickness from 7 nm to 15 nm, a tantalum oxide layer having a thickness from 14 nm to 34 nm, and a silicon oxide layer having a thickness from 81 nm to 86 nm. Alternatively, a configuration may be employed in which:
the auxiliary electrodes are formed on the second surface of the electrode;
the contact layer is formed between the light-receiving layer and the first surface of the electrode; and
the portion of the second surface of the electrode, exposed between the auxiliary electrodes, is provided with recesses and projections. Further, the solar cell of the disclosure, including the preferred embodiments described above, may encompass an embodiment in which a condenser lens configured of a Fresnel lens is provided on the light entering side, i.e., may be the concentrating solar cell, for example.

In the receiving/emitting element, etc., of the disclosure, the concentration of the additive contained in the transparent conductive material near an interface to the first surface of the electrode is higher than the concentration of the additive contained in the transparent conductive material near the second surface of the electrode. As used herein, the wording "near an interface to the first surface of the electrode" refers to a region that occupies 10% of the thickness of the electrode from the first surface of the electrode to the second surface of the electrode, the wording "near an interface to the second surface of the electrode" refers to a region that occupies 10% of the thickness of the electrode from the second surface of the electrode to the first surface of the electrode, and the wording "concentration of the additive" refers to mean concentration of those regions.

Examples of the additive, configuring the transparent conductive material and made of a metal compound, may include a tungsten oxide, a chromium oxide, a ruthenium oxide, a titanium oxide, a molybdenum oxide, a nickel oxide, a zinc oxide, an iron oxide, and a copper oxide.

A configuration and a structure of the solar cell, the optical sensor, the light emitting diode, or the surface emitting laser element of the disclosure itself may be a known configuration and a known structure, respectively.

Formation of the light receiving/emitting layer, the light receiving layer, and the light emitting layer in each of which the plurality of compound semiconductor layers are stacked, as well as formation of the contact layer, may be performed based on a method such as a metal organic chemical vapor deposition method (MOCVD method or MOVPE method), a molecular beam epitaxy method (MBE method), and a hydride vapor phase epitaxy method in which halogen contributes to transport or reaction.

Basically, the electrode described above (referred to as a "first electrode" for the sake of convenience) may be formed based on a sputtering method. Specifically, to cause the additive to be contained in the transparent conductive material that configures the electrode, a target made of the transparent conductive material (referred to as a "transparent conductive material target") and a target made of the additive (referred to as an "additive target") may be disposed inside a sputtering system, for example. Then, sputtering may be performed that uses the additive target to attach the additive to the transparent conductive material target, following which the transparent conductive material target, to which the additive is being attached, is used to perform sputtering for formation of the transparent conductive material that contains the additive, without performing so-called pre-sputtering. The formation of the first electrode, however, is not limited to the method described above.

The auxiliary electrodes formed on the second surface of the electrode each may be configured by layers such as: an AuGe layer/an Ni layer/an Au layer; an Mo layer/a Ti layer/a Pt layer/an Au layer; an Ti layer/a Pt layer/an Au layer; and an Ni layer/an Au layer, and may be formed based on a PVD method such as a sputtering method and a vacuum deposition method. Note that the foremost layer among "/" occupies the first electrode side.

To provide the portion of the second surface of the first electrode, exposed between the auxiliary electrodes, with the recesses and projections, microparticles made of a transparent conductive material may be attached to the second surface of the first electrode followed by etching of the second surface of the first electrode that includes the microparticles, for example.

The light receiving/emitting element, etc., of the disclosure, including the preferred embodiments and configurations described above, is provided on a support substrate. The film-formation substrate used upon the manufacturing of the light receiving/emitting element, etc., of the disclosure and the support substrate may be the same substrate or different substrates from each other. Note that, for the sake of convenience, the substrate, where the film-formation substrate and the support substrate are the same substrate, is referred to as a "film-formation/support substrate". Also, the film-formation substrate and the support substrate, where they are different from each other, are referred to as a "film-formation substrate" and a "support substrate", respectively. In this case, the light receiving/emitting element, etc., of the disclosure may be formed on the film-formation substrate, following the film-formation substrate may be removed from the light receiving/emitting element, etc., of the disclosure and the light receiving/emitting element, etc., of the disclosure may then be fixed to or bonded to the support substrate. Examples of the method of removing the film-formation substrate from the light receiving/emitting element, etc., of the disclosure may include a laser ablation method, a heating method, and an etching method. Also, examples of the method of fixing or bonding the light receiving/emitting element, etc., of the disclosure to the support substrate may include a metal joining method, a semiconductor joining method, and a metal-semiconductor joining method, besides a method of using an adhesive.

Examples of the film-formation substrate may include a substrate configured of a Group III-V semiconductor and a substrate configured of a Group II-VI semiconductor. Specific examples of a material of the substrate configured of the Group III-V semiconductor may include GaAs, InP, GaN, and AlN. Specific examples of a material of the substrate configured of the Group II-VI semiconductor may include CdS, CdTe, ZnSe, and ZnS. Alternatively, a Si substrate or a sapphire substrate may be used. Further, a substrate configured of a Group semiconductor referred to as a chalcopyrite-based semiconductor, made of Cu, In, Ga, Al, Se, S, or the like may be used, specific examples of which may include $Cu(In,Ga)Se_2$ abbreviated as CIGS, $Cu(In,Ga)(Se,S)_2$ abbreviated as CIGSS, and $CuInS_2$ abbreviated as CIS.

Also, besides the various substrates described above, examples of the support substrate may include a transparent inorganic substrate such as a glass substrate and a quartz substrate, a transparent plastic substrate, and a transparent plastic film. Examples of materials of the transparent plastic substrate and the transparent plastic film may include: a polyester resin such as polyethylene terephthalate (PET) and polyethylene naphthalate (PEN); a polycarbonate (PC) resin; a polyether sulfone (PES) resin; a polyolefin resin such as polystyrene, polyethylene, and polypropylene; a polyphenylenesulfide resin; a polyvinylidene fluoride resin; a tetra-acetyl cellulose resin; a brominated phenoxy resin; an aramid resin; a polyimide resin; a polystyrene resin; a polyarylate resin; a polysulfone resin; an acrylic resin; an epoxy resin; a fluororesin; a silicone resin; a diacetate resin; a triacetate resin; a polyvinyl chloride resin; and a cyclic polyolefin resin. Examples of the glass substrate may include a soda glass substrate, a heat-resistant glass substrate, and a vitreous silica substrate.

The light receiving/emitting element, etc., of the disclosure is provided with a second electrode in addition to the first electrode described above. The second electrode is formed in contact with the compound semiconductor layer. Alternatively, depending on a material configuring the film-formation/support substrate or the support substrate, the film-formation/support substrate or the support substrate itself may be used as the second substrate, or the second substrate may be formed in contact with the film-formation/support substrate or the support substrate. Examples of a material configuring the second electrode may include molybdenum (Mo), tungsten (W), tantalum (Ta), vanadium (V), palladium (Pd), Zinc (Zn), nickel (Ni), titanium (Ti), platinum (Pt), gold-zinc (Au—Zn), gold-germanium (AuGe), chromium (Cr), gold (Au), and aluminum (Al).

Example 1

Example 1 relates to the light receiving/emitting element, the solar cell, and the optical sensor of the disclosure, and further to the light receiving/emitting element, etc., of the disclosure having the first configuration. As illustrated in FIG. 1A as a schematic cross-sectional view, a light receiving/emitting element 11, a solar cell 11, or an optical sensor 11 in the Example 1 includes:

(A) a light receiving/emitting layer (a light receiving layer) 21 in which a plurality of compound semiconductor layers are stacked; and (B) an electrode (in the following, referred to as a "first electrode 30" for the sake of convenience) having a first surface 30A and a second surface 30B and made of a transparent conductive material, in which the second surface 30B faces the first surface 30A, and the electrode is in contact, at the first surface 30A, with the light receiving/emitting layer (light receiving layer) 21. Note that the solar cell 11 in the Example 1 is a non-concentrating solar cell.

Here, the light receiving/emitting layer (light receiving layer) 21 is formed on the substrate 20 configured of a p-type GaAs substrate, and specifically, is configured of a first compound semiconductor layer 22 made of p-GaAs and a second compound semiconductor layer 23 made of n-GaAs. A front surface field (FSF) layer 24 made of n-AlInP is formed on the second compound semiconductor layer 23. These compound semiconductor layers are formed based on an MOCVD method or an MBE method. Also, a second electrode 25 configured of Ti/Pt/Au is formed on a lower surface of the substrate 20, based on a PVD method such as a vacuum deposition method and a sputtering method. A configuration and a structure of the solar cell 11 in the Example 1 itself are a known configuration and a known structure, respectively. A terminal portion (unillustrated) for taking out electric power to the outside is provided in an unillustrated region of each of the first electrode 30 and the second electrode 25. The same applies to Examples to be described hereinafter.

In addition, in the Example 1 or Examples 2 to 5 to be described later, the transparent conductive material contains an additive made of one or more metals, or a compound thereof, selected from the group consisting of a Group 6 transition metal such as molybdenum, tungsten, and chromium, and of ruthenium, titanium, nickel, zinc, iron, and copper (specifically, molybdenum or Mo in each of the Examples), and concentration of the additive contained in the transparent conductive material near an interface to the first surface 30A of the first electrode 30 is higher than concentration of the additive contained in the transparent conductive material near the second surface 30B of the first electrode 30.

Here, unless otherwise noted, a compound semiconductor configuring the compound semiconductor layer is a GaAs-based compound semiconductor and the transparent conductive material is ITO in the Example 1 or Examples 2 to 5 to be described later.

Also, in the Example 1, the first electrode 30 has a stacked structure including the first layer 31 and the second layer 32 from the light receiving/emitting layer side, the additive is contained in the transparent conductive material configuring the first layer 31, and no additive is contained in the transparent conductive material configuring the second layer 32. Specifically, mean concentration $Ic_1$ of the additive contained in the transparent conductive material configuring the first layer 31 and mean concentration $Ic_e$ of the additive contained in the transparent conductive material configuring the second layer 32 are as shown in Table 1 as follows. Also, when electrical resistivity of the first layer is $R_1$, electrical resistivity of the second layer is $R_2$, light transmittance of the first layer and the light transmittance of the second layer are $TP_1$ and $TP_2$, respectively, where a wavelength ranges from 400 nm to 900 nm in a GaAs-based (including GaAs and GaInP) two-junction solar cell, a thickness of the first layer is $T_1$, and a thickness of the second layer is $T_2$, values thereof are as shown in the Table 1. Further, mean light transmittance of the first electrode 30, mean electrical resistivity of the first electrode 30, and contact resistance between the first electrode 30 and the light receiving/emitting layer 21 are as shown in the Table 1 as follows. Incidentally, a value of mean light absorptance of the first electrode is a mean value which is in a measurement wavelength ranging from 400 nm to 900 nm and obtained by forming the first electrode (a thickness of the first layer is 5 nm and a thickness of the second layer is 25 nm) on a glass substrate and measuring the same, and subtracting light absorptance of the glass substrate therefrom.

TABLE 1

Figure 4:
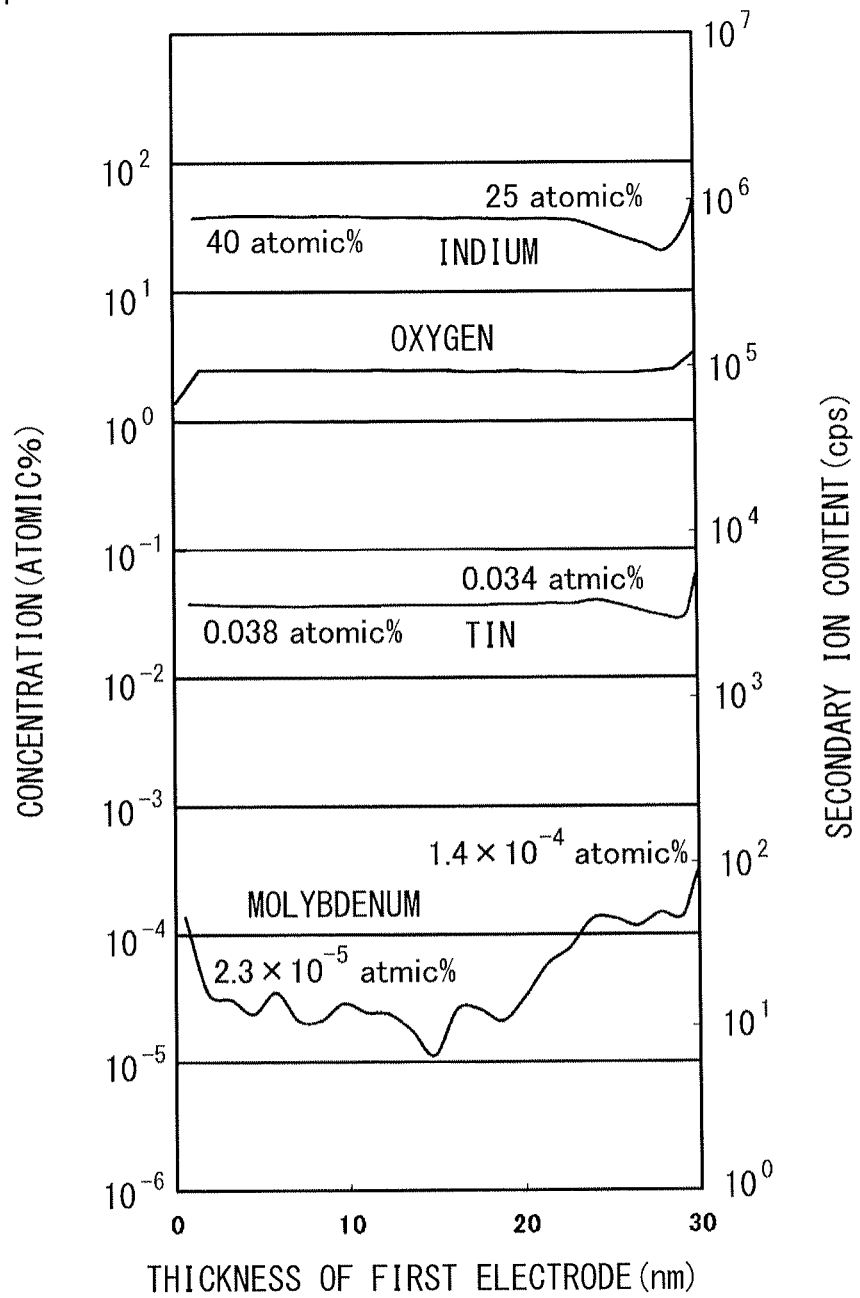
FIG. 4 is a graph showing a result of secondary ion mass spectrometry in a thickness direction of an electrode in the Example 1.

$Ic_1 = 1.1 \times 10^{17}$ cm$^{-3}$
$Ic_2 = 1.8 \times 10^{16}$ cm$^{-3}$
$R_1 = 2.5 \times 10^{-4}$ Ω·cm
$R_2 = 1.5 \times 10^{-4}$ Ω·cm
$TP_1 = 97\%$
$TP_2 = 99\%$
$T_1 = 5$ nm
$T_2 = 25$ nm
$Ic_1/Ic_2 = 6.1$
$R_2/R_1 = 0.6$
$TP_2 \times TP_1 = 0.96$
$T_2/T_1 = 5.0$
Mean light absorptance of first electrode = 0.98%
Mean electrical resistivity of first electrode = $2 \times 10^{-4}$ Ω·cm or less
Contact resistance between first electrode and light receiving/emitting layer = $2.7 \times 10^{-5}$ Ω·cm$^2$ A secondary ion mass spectrometry (SIMS) was conducted in a thickness direction of the first electrode 30 in the Example 1. FIG. 4 shows a result thereof in which a horizontal axis of FIG. 4 represents a thickness (unit: nm) of the first electrode 30, where 0 nm denotes a top face of the second layer 32 and 30 nm denotes an interface between the first layer 31 and the front surface field layer 24. Also, numerical values indicated on the right side of the spectrometry result for indium, tin, and molybdenum each denote a mean concentration value in the first layer 31, and numerical values indicated on the left side thereof each denote a mean concentration value in the second layer 32. It is to be noted that there is a clear difference in concentration between the first layer 31 and the second layer 32 when paying attention to concentration of molybdenum.

Figure 5A:
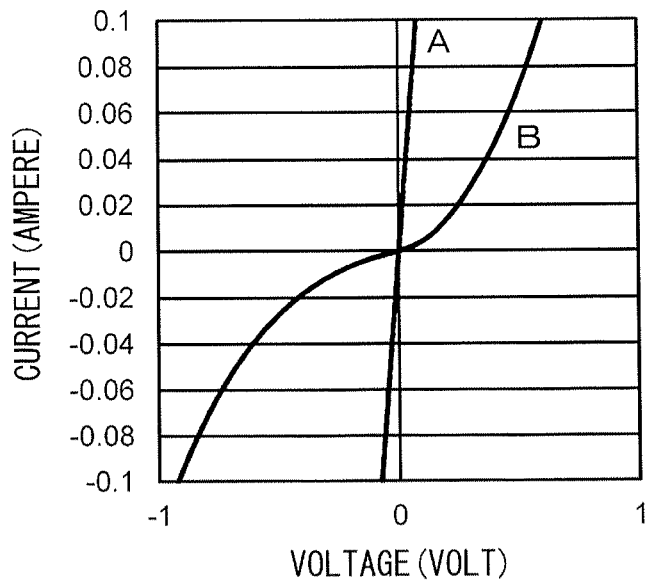
FIG. 5A is a graph showing a result of measuring a current flowing upon application of a voltage to an electrode configured of an ITO layer and a current flowing upon application of a voltage to an electrode configured of an ITO layer containing molybdenum as an additive.
Figure 5B:
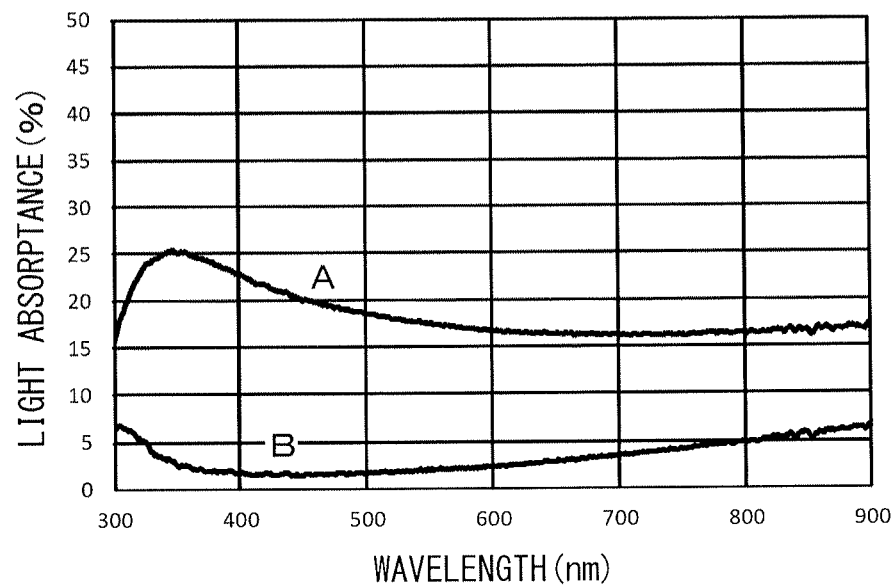
FIG. 5B is a graph showing a result of measuring light absorptance of the ITO layer and light absorptance of the ITO layer containing molybdenum as the additive.
Figure 6:
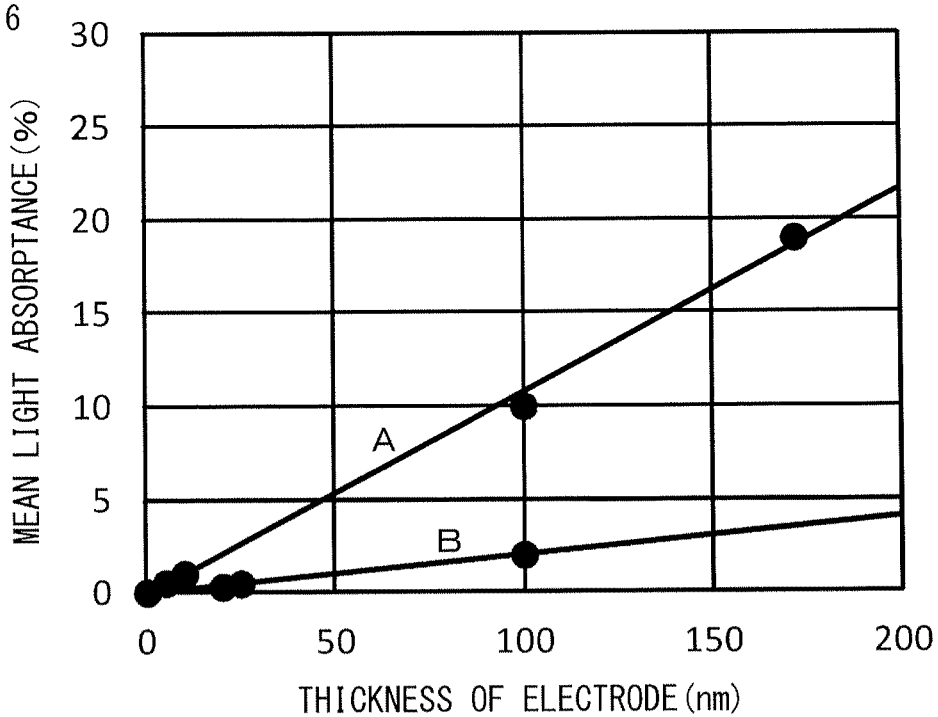
FIG. 6 is a graph showing a result of examining a relationship between a thickness of each of the electrodes configured of the ITO layer and the ITO layer containing molybdenum as the additive and mean light absorptance.
Figure 7:
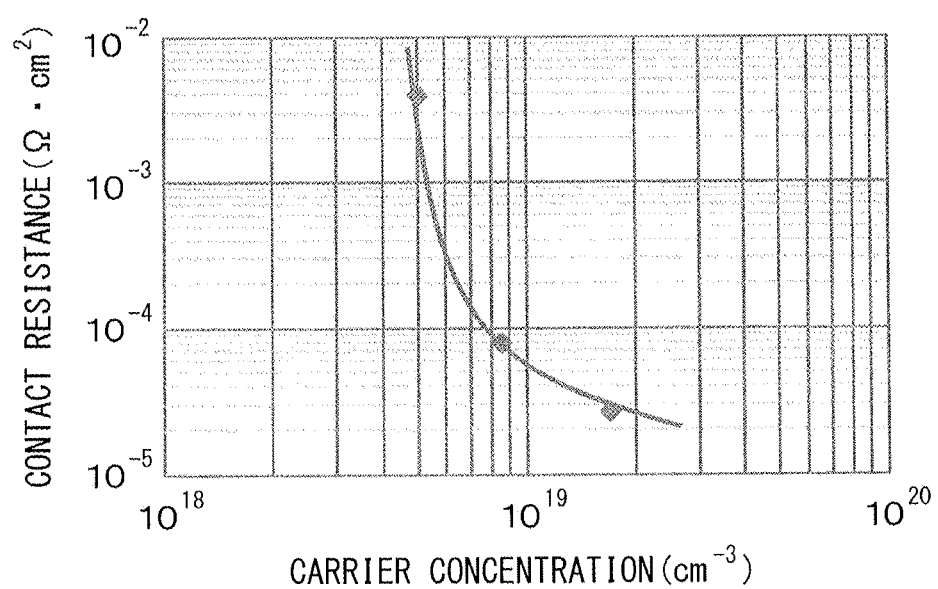
FIG. 7 is a graph showing a result of examining a relationship between carrier concentration of each n-GaAs layer, in which a first electrode was formed on each of n-GaAs layers having various carrier concentrations, and contact resistance between the first electrode and a light receiving/emitting layer.

Also, for the test purpose, two electrodes (thickness of ITO layer: 65 nm, thickness of Mo layer: 200 nm, interelectrode distance: 4 μm, and concentration of additive: $1.1 \times 10^{17}$ cm$^{-3}$) each configured of an ITO layer containing molybdenum as the additive were formed on an n$^+$-GaAs layer to measure a current flowing upon application of a voltage to those electrodes. Similarly, two electrodes (thickness of ITO layer: 65 nm, thickness of Mo layer: 200 nm, and interelectrode distance: 4 μm) each configured of a stacked structure including an ITO layer and a metal layer made of Mo were formed on an n$^+$-GaAs layer to measure a current flowing upon application of a voltage to those electrodes. FIG. 5A shows results thereof, in which "A" in FIG. 5A shows a measurement result of the electrodes each configured of the ITO layer containing molybdenum as the additive, whereas "B" shows a measurement result of the electrodes each configured of the stacked structure. Also, the contact resistance between the first layer and the second layer of the first electrode was about $10^{-7}$ Ω·cm$^2$ (about $10^{-11}$ Ω·m$^2$). Further, an ITO layer (thickness: 65 nm) and an ITO layer (thickness: 65 nm and concentration of additive: $1.1 \times 10^{17}$ cm$^{-3}$) containing molybdenum as the additive were formed of respective glass substrates to measure light absorptance of those layers. FIG. 5B shows results thereof, in which "A" in FIG. 5B shows a measurement result of an electrode configured of the ITO layer containing molybdenum as the additive, whereas "B" shows a measurement result of an electrode configured of the ITO layer. Note that light absorptance of the glass substrates are removed in the results shown in FIG. 5B. Also, a relationship was examined between a thickness of each of electrodes made of the ITO layer and the ITO layer containing molybdenum as the additive (concentration of additive: $1.1 \times 10^{17}$ cm$^{-3}$) and mean light absorptance, results of which are as shown in a graph in FIG. 6. In FIG. 6, "A" shows a measurement result of the electrode configured of the ITO layer containing molybdenum as the additive, whereas "B" shows a measurement result of the electrode configured of the ITO layer. Further, a relationship was examined between carrier concentration of each n-GaAs layer, in which the first electrode 30 was formed on each of n-GaAs layers having various carrier concentrations, and contact resistance between the first electrode and the light receiving/emitting layer, results of which are as shown in FIG. 7. It is to be noted that the contact resistance is decreased with an increase in the carrier concentration.

Also, a first electrode configured of a first layer and a second layer was formed using AZO (aluminum-oxide-doped zinc oxide) instead of ITO. The following Table 2 shows characteristics of the first electrode.

TABLE 2

$Ic_1 = 1.0 \times 10^{17}$ cm$^{-3}$
$Ic_2 = 2.0 \times 10^{16}$ cm$^{-3}$
$R_1 = 7.0 \times 10^{-4}$ Ω · cm
$R_2 = 6.70 \times 10^{-4}$ Ω · cm
$TP_1 = 97\%$
$TP_2 = 99\%$
$T_1 = 5$ nm
$T_2 = 25$ nm
$Ic_1/Ic_2 = 5.0$
$R_2/R_1 = 0.96$
$TP_2 \times TP_1 = 0.96$
$T_2/T_1 = 5.0$
Mean light absorptance of first electrode = 1.0%
Mean electrical resistivity of first electrode = $7.4 \times 10^{-4}$ Ω · cm or less
Contact resistance between first electrode and light receiving/emitting layer = $1 \times 10^{-4}$ Ω · cm$^2$ or less The following Table 3 shows a measurement result of contact resistance (unit: Ω·cm$^2$) between respective first electrodes using ITO and AZO and various compound semiconductor layers. Note that a numerical value in each ( ) in the Table 3 denotes carrier concentration (unit: cm$^{-3}$). It can be understood that the use of tellurium (Te) is preferable for an impurity for forming an n-type second compound semiconductor layer.

TABLE 3

|  | ITO |  | AZO |
| --- | --- | --- | --- |
| p-GaAs:Zn | ($2 \times 10^{19}$) | $4.5 \times 10^{-5}$ | $1.9 \times 10^{-3}$ |
| p-GaP:Zn | ($2 \times 10^{19}$) | $1.4 \times 10^{-3}$ |  |
| n-GaInP:Si | ($2 \times 10^{19}$) | $5.5 \times 10^{-4}$ |  |
| n-GaAs:Si | ($5.0 \times 10^{18}$) | $4.0 \times 10^{-3}$ |  |
| n-GaAs:Si | ($8.5 \times 10^{18}$) | $8.0 \times 10^{-5}$ |  |
| n-GaAs:Te | ($1.7 \times 10^{19}$) | $2.7 \times 10^{-5}$ |  |

The first electrode 30 was formed, specifically, based on the following method. Namely, a sputtering system in which the transparent conductive material target made of the transparent conductive material (ITO) and the additive target made of the additive (Mo) were disposed was prepared for formation of the first layer 31 of the first electrode 30. Then, first, sputtering was performed in which the additive target was used to attach the additive to the transparent conductive material target, following which the substrate 20, formed with the light receiving/emitting layer (light receiving layer) 21 in which the plurality of compound semiconductor layers were stacked, was brought into the sputtering system, and the transparent conductive material target attached with the additive was used to perform sputtering for formation of the first layer 31 of the first electrode 30, without performing so-called pre-sputtering. Thereafter, the clean transparent conductive material target was used to perform sputtering for formation of the second layer 32 of the first electrode 30.

In the light receiving/emitting element, the solar cell, or the optical sensor of the Example 1, the transparent conductive material configuring the first electrode contains molybdenum (Mo) as the additive. Further, the concentration of the additive contained in the transparent conductive material near the interface to the first surface of the first electrode is higher than the concentration of the additive contained in the transparent conductive material near the second surface of the first electrode. Hence, it is possible to provide the first electrode that satisfies both low contact resistance and high light transmittance.

Example 2

Figure 1B:
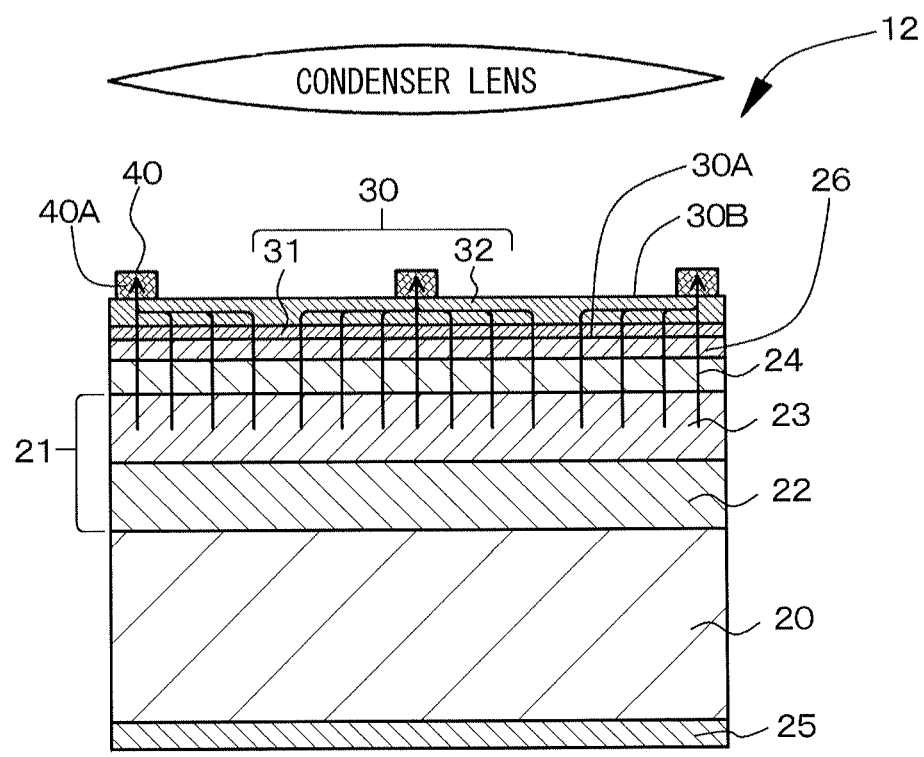

Example 2 is a modification of the Example 1. As illustrated in FIG. 1B as a schematic cross-sectional view, a light receiving/emitting element 12 or a solar cell 12 in the Example 2 is a concentrating solar cell in which a condenser lens configured of a Fresnel lens is provided on the light entering side.

In addition, auxiliary electrodes 40 each configured of an AuGe layer/a Ni layer/an Au layer (the AuGe layer is on the first electrode 30 side) are formed on the second surface 30B of the first electrode 30. The auxiliary electrode 40 has a configuration in which a plurality of branch auxiliary electrodes 40A extend parallel to one another, and both ends of the respective branch electrodes 40A are connected to one another by connection portions (unillustrated). Note that the branch auxiliary electrodes 40A extend in a direction perpendicular to the drawing in FIG. 1B. The auxiliary electrode 40 may be formed based on a PVD method such as a sputtering method and a vacuum deposition method. Note that the auxiliary electrode 40 is illustrated as having one layer in the drawing. In addition, a contact layer 26 is formed between the light receiving/emitting layer 21 and the second surface 30B of the first electrode 30. Here, light transmittance of the contact layer 26 is substantially 100%, and is configured of a compound semiconductor same as a compound semiconductor that configures one or more layers in the plurality of compound semiconductor layers configuring the light receiving/emitting layer 21. More specifically, the light receiving/emitting layer 21 has a stacked structure including the n-type second compound semiconductor layer 23 and the p-type first compound semiconductor layer 22 from the contact layer side, and the contact layer 26 is made of n$^+$-type GaAs. A thickness of the contact layer 26 is 10 nm, and carrier concentration thereof is $8.5 \times 10^{18}$ cm$^{-3}$.

Figure 11A:
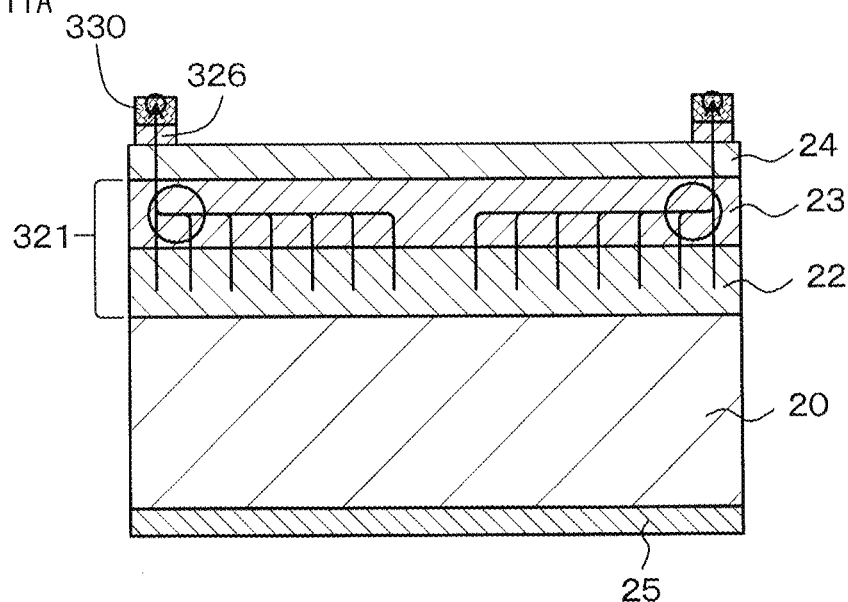
FIGS. 11A and 11B are each a schematic cross-sectional view of an existing solar cell.

In an existing solar cell, a schematic cross-sectional view of which is as illustrated in FIG. 11A, a first electrode 330 having a shape similar to that of the auxiliary electrode 40 in the Example 2 is formed on the front surface field layer 24 via a contact layer 326. Here, the first electrode 330 is configured of an AuGe layer/a Ni layer/an Au layer (the AuGe layer is on the front surface field layer 24 side), and the contact layer 326 is made of n$^+$-GaAs. To prevent light having entered the solar cell from being absorbed by the contact layer 326, the contact layer 326 is removed from a region between the first electrodes 330. In such an existing solar cell, a current generated at a light receiving layer 321 flows in a manner denoted by arrows in FIG. 11A. In addition, when the solar cell having such a configuration is applied to that of a concentrating type, a loss attributed to resistance is large as a result of a flow of large current at portions encircled in FIG. 11A.

For this reason, typically, in the existing concentrating solar cell as illustrated in a schematic cross-sectional view in FIG. 1B, a large number of thick first electrodes 330 are formed, and a film thickness of an n-GaAs layer (emitter layer) 323 formed on the first compound semiconductor layer 22 made of p-GaAs is made thick. This, however, causes an issue of a decrease in the area at which light is collected of the solar cell due to the formation of a large number of first electrodes 330, as well as an issue of an increase in a recombination loss resulting from a larger film thickness of the n-GaAs layer (emitter layer) 323.

Figure 11B:
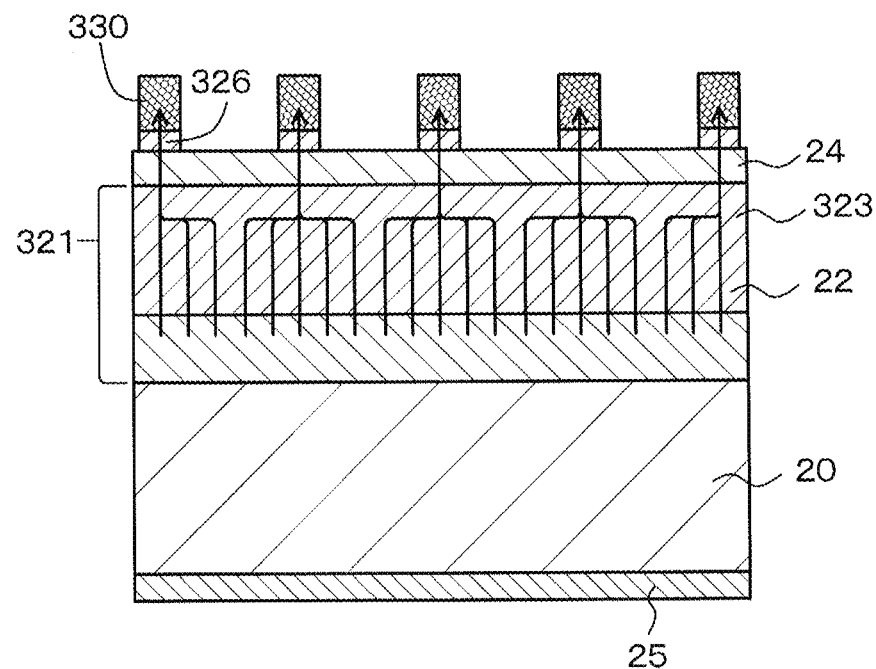

In contrast, in the Example 2, although the contact layer 26 is formed between the light receiving/emitting layer 21 and the second surface 30B of the first electrode 30, the light transmittance of the contact layer 26 is as described above, making it possible to prevent absorption of light that has entered the solar cell 12 and to become transparent to the light that has entered the solar cell 12. In addition, the first electrode 30 is formed on the contact layer 26. For this reason, it is possible to reduce the number of auxiliary electrodes 40 as compared with the number of first electrodes 330 in the existing solar cell illustrated in FIG. 11B. Also, a current generated at the light receiving/emitting layer (light receiving layer) 21 flows in a manner denoted by arrows in FIG. 1B. Hence, in the concentrating solar cell 12 having the configuration as described above, the number of portions at which the current concentrates are reduced as compared with the existing solar cell illustrated in FIG. 11B, eliminating the necessity to make a film thickness of the second compound semiconductor layer (emitter layer) 23 thick. As described in the foregoing, it is possible for the solar cell 12 in the Example 2 to ensure that the issue of the decrease in the light collecting area as well as the issue of the increase in the recombination loss resulting from a larger film thickness of the second compound semiconductor layer (emitter layer) 23 are avoided.

Example 3

Figure 2:
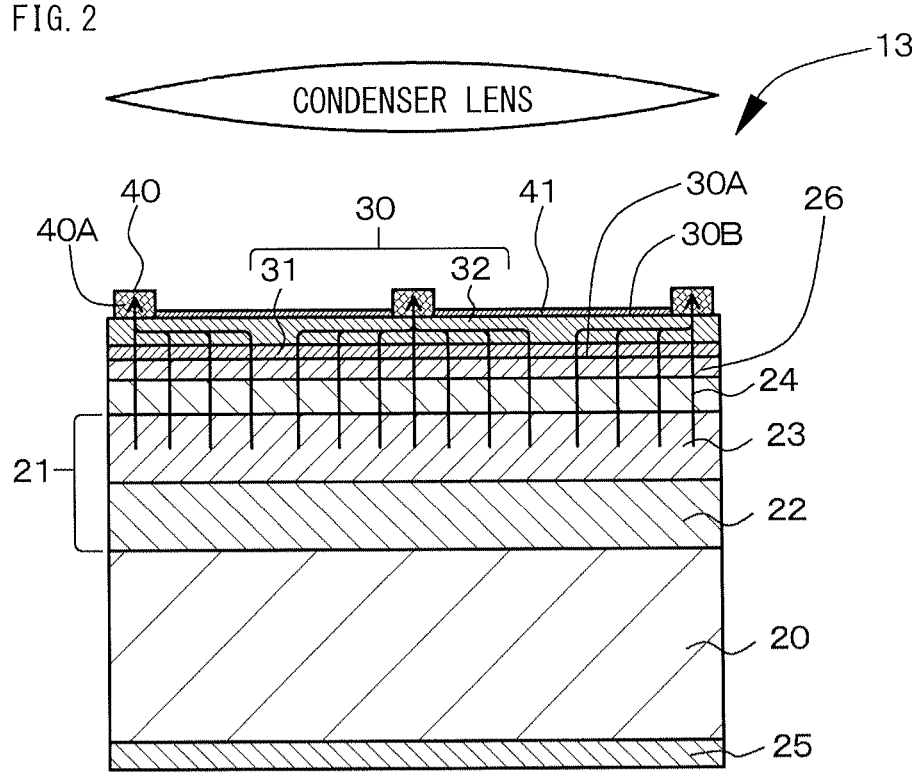
FIG. 2 is a schematic cross-sectional view of the light receiving/emitting element and the solar cell in Example 3.

Example 3 is a modification of the Example 2. As with the Example 2, in a light receiving/emitting element 13 or a solar cell 13 in the Example 3, the auxiliary electrodes 40 are formed on the second surface 30B of the first electrode 30 and the contact layer 26 is formed between the light receiving/emitting layer (light receiving layer) 21 and the first surface 30A of the first electrode 30, as illustrated in FIG. 2 as a schematic cross-sectional view. In addition, in the Example 3, a reflection prevention film 41 is further formed on the exposed second surface of the first electrode 30. Note that the reflection prevention film 41 is illustrated as having one layer in FIG. 2.

For example, the reflection prevention film 41 and the auxiliary electrodes 40 may be formed based on the following method. Namely, for example, a resist pattern may be formed on the first electrode 30 on the basis of a photolithography technique followed by formation of the auxiliary electrodes 40 using a vacuum deposition method, following which the resist pattern may be removed to form the auxiliary electrodes 40 on the basis of a lift-off method. Then, a resist pattern may be formed based on a photolithography technique followed by formation of the reflection prevention film 41 using a vacuum deposition method, following which the resist pattern may be removed to form the reflection prevention film 41 using a lift-off method.

Incidentally, finding of a relationship between a thickness and light reflectance of an ITO layer turned out that a value of mean light reflectance was 15.09% in the ITO layer whose thickness was 170 nm, where a reflection prevention film having a stacked structure including a 118 nm thick tantalum oxide and an 89 nm thick silicon oxide was formed on the ITO layer. On the other hand, it turned out that a value of the mean light reflectance was 2.95% in the ITO layer whose thickness was 30 nm, where a reflection prevention film having a stacked structure including a 16 nm thick tantalum oxide and a 64 nm thick silicon oxide was formed on the ITO layer. Note that the film thickness of each of the tantalum oxide and the silicon oxide was optimized for each ITO layer. It can be understood from these results that sufficiently low light reflectance is not obtainable even upon the optimization of the reflection prevention film when the thickness of the ITO layer is large, and that the sufficiently low light reflectance is obtainable by optimizing the reflection prevention film when the thickness of the ITO layer is small, although small thickness of the ITO layer leads to an increase in sheet resistance ($\Omega/\square$) of the ITO layer. Hence, achieving an electrode low in sheet resistance yet small in thickness makes it possible to achieve an electrode low in sheet resistance and low in light reflectance with a combination of an appropriate reflection prevention film.

Figure 8:
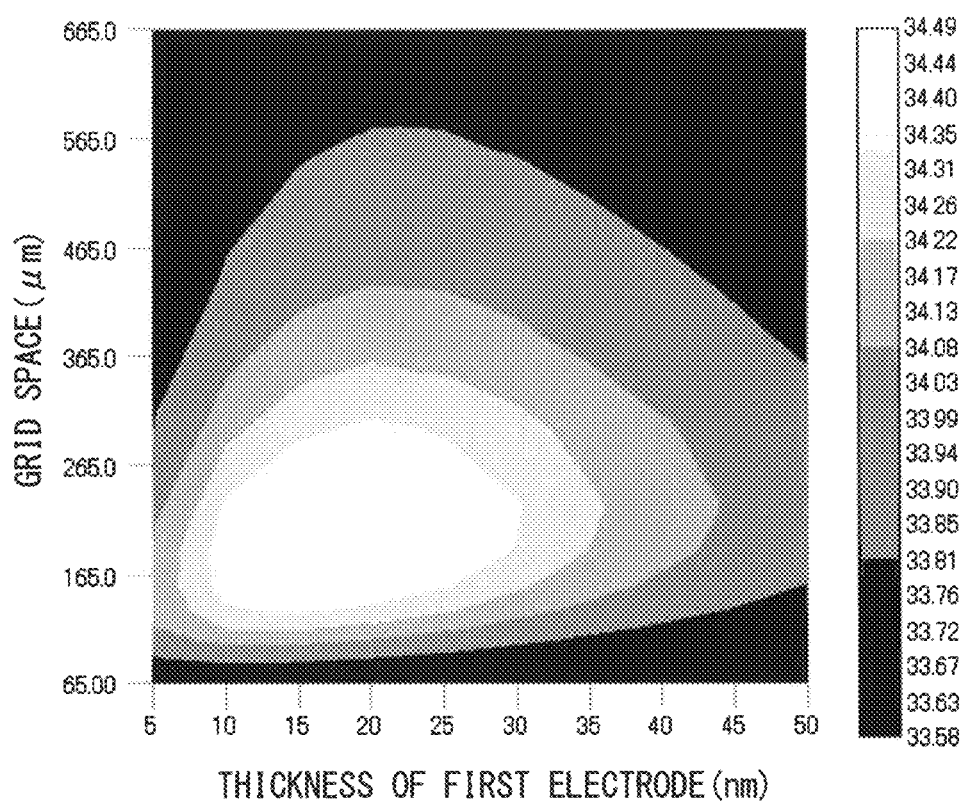
FIG. 8 is a graph showing a result of a simulation of a maximum conversion efficiency on the basis of a reflection prevention film having a stacked structure including a zinc sulfide layer and a magnesium fluoride layer in Example 3A, where a thickness of the first electrode and a width of a portion of a second surface of the first electrode, exposed between auxiliary electrodes, were set as parameters.
Figure 9:
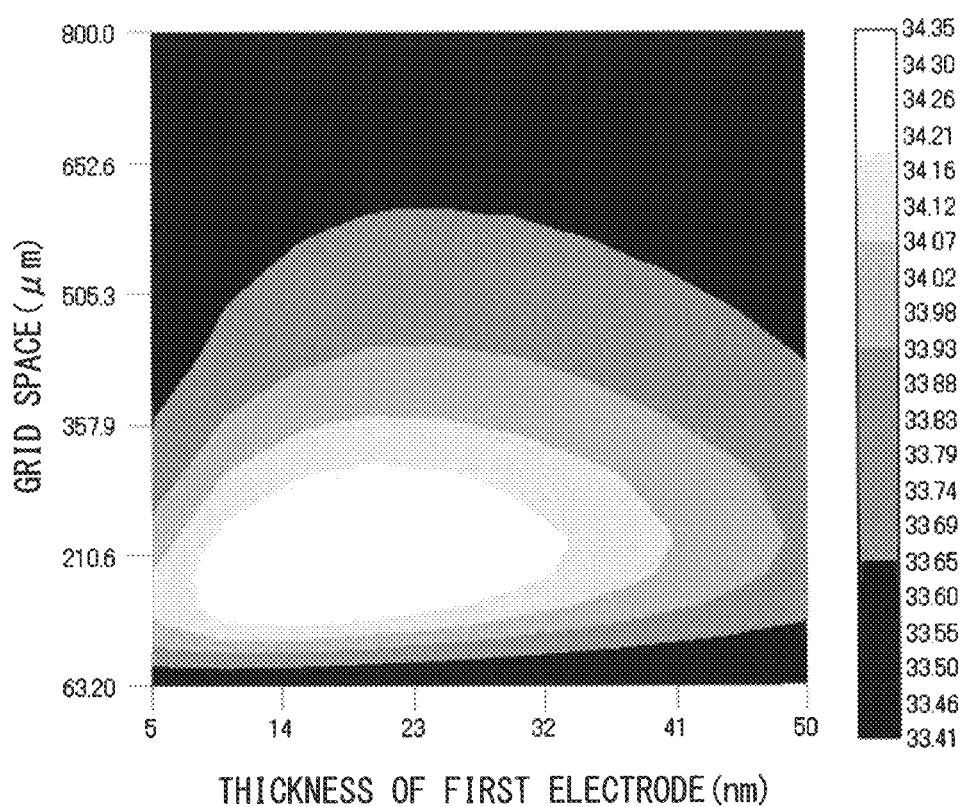
FIG. 9 is a graph showing a result of the simulation of the maximum conversion efficiency on the basis of the reflection prevention film having a stacked structure including a tantalum oxide layer and a silicon oxide layer in Example 3B, where a thickness of the first electrode and a width of the portion of the second surface of the first electrode, exposed between the auxiliary electrodes, were set as parameters.
Figure 10:
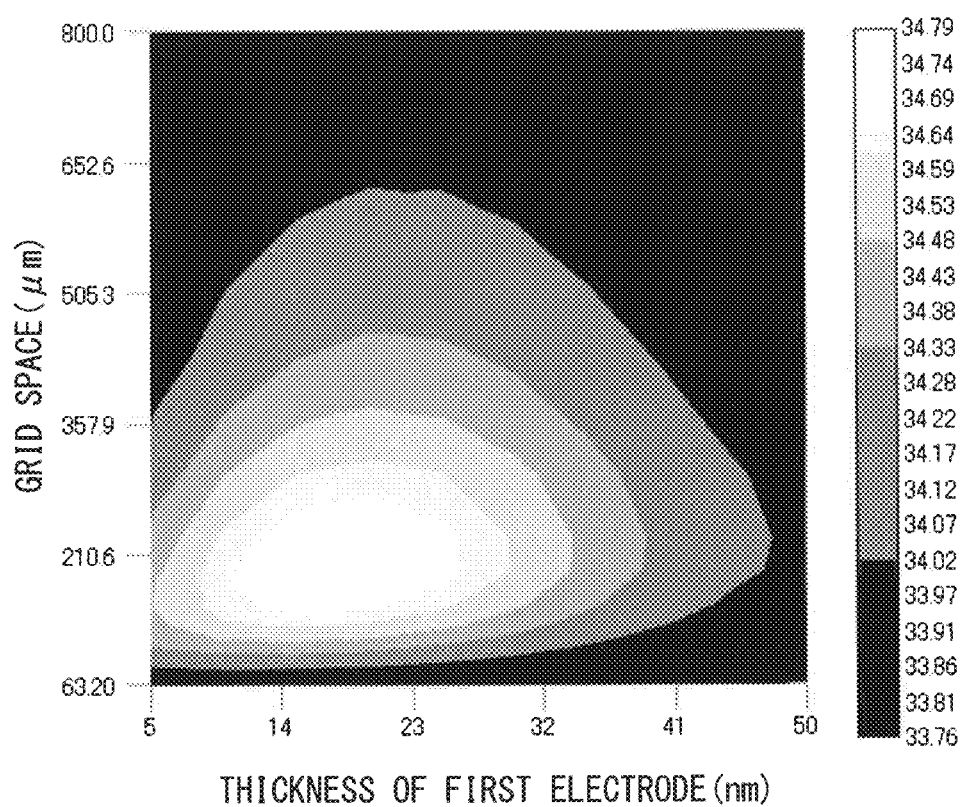
FIG. 10 is a graph showing a result of the simulation of the maximum conversion efficiency on the basis of the reflection prevention film having a stacked structure including a titanium oxide layer, a tantalum oxide layer, and a silicon oxide layer in Example 3C, where a thickness of the first electrode and a width of the portion of the second surface of the first electrode, exposed between the auxiliary electrodes, were set as parameters.

In Example 3A, a width (described as "grid space" in the drawings) of a portion of the second surface 30B of the first electrode 30, exposed between the auxiliary electrodes 40, was from 145 μm to 285 μm, a thickness of the first electrode 30 was from 10 nm to 30 nm, and the reflection prevention film 41 had a stacked structure including a zinc sulfide layer having a thickness from 17 nm to 36 nm and a magnesium fluoride layer having a thickness from 85 nm to 93 nm (the zinc sulfide layer was on the first electrode side). The following Table 4 shows a simulation result of a thickness of the first electrode 30 versus a film thickness configuration of the reflection prevention film for obtaining a minimum light reflection amount. Also, a simulation result of a maximum conversion efficiency, where a thickness of the first electrode 30 and a width of the portion of the second surface 30B of the first electrode 30, exposed between auxiliary electrodes 40, were set as parameters, is shown in FIG. 8. In FIGS. 8 to 10, the maximum conversion efficiency decreases as going from a white region to a black region. The maximum conversion efficiency in a most white region and the maximum conversion efficiency in a most black region were 34.49% and 33.58%, respectively, in FIG. 8. Also, in FIG. 9, the maximum conversion efficiency in the most white region and the maximum conversion efficiency in the most black region were 34.35% and 33.41%, respectively. Further, in FIG. 10, the maximum conversion efficiency in the most white region and the maximum conversion efficiency in the most black region were 34.79% and 33.76%, respectively.

On the other hand, in Example 3B, a width of the portion of the second surface 30B of the first electrode 30, exposed between the auxiliary electrodes 40, was from 145 μm to 285 μm, a thickness of the first electrode 30 was from 10 nm to 30 nm, and the reflection prevention film 41 had a stacked structure including a tantalum oxide layer having a thickness from 18 nm to 32 nm and a silicon oxide layer having a thickness from 71 nm to 76 nm (the tantalum oxide layer was on the first electrode side). The following Table 4 shows a simulation result of the thickness of the first electrode 30 versus the film thickness configuration of the reflection prevention film for obtaining the minimum light reflection amount. Also, a simulation result of the maximum conversion efficiency, where a thickness of the first electrode 30 and a width of the portion of the second surface 30B of the first electrode 30, exposed between auxiliary electrodes 40, were set as parameters, is shown in FIG. 9.

On the other hand, in Example 3C, a width of the portion of the second surface 30B of the first electrode 30, exposed between the auxiliary electrodes 40, was from 145 μm to 285 μm, a thickness of the first electrode 30 was from 10 nm to 25 nm, and the reflection prevention film 41 had a stacked structure including a titanium oxide layer having a thickness from 7 nm to 15 nm, a tantalum oxide layer having a thickness from 14 nm to 34 nm, and a silicon oxide layer having a thickness from 81 nm to 86 nm (the titanium oxide layer was on the first electrode side). The following Table 4 shows a simulation result of the thickness of the first electrode 30 versus the film thickness configuration of the reflection prevention film for obtaining the minimum light reflection amount. Also, a simulation result of the maximum conversion efficiency, where a thickness of the first electrode 30 and a width of the portion of the second surface 30B of the first electrode 30, exposed between auxiliary electrodes 40, were set as parameters, is shown in FIG. 10.

TABLE 4

(unit: nm)

| Thickness of First Electrode | Example 3A | | Example 3B | | Example 3C | | |
|---|---|---|---|---|---|---|---|
| | Zinc Sulfide Layer | Magnesium Fluoride Layer | Silicon Oxide Layer | Silicon Oxide Layer | Titanium Oxide Layer | Tantalum Oxide Layer | Silicon Oxide Layer |
| 5 | 42.8 | 94.3 | 43.4 | 79.6 | 19.9 | 40.8 | 86.2 |
| 10 | 36.5 | 93.1 | 37.6 | 78.0 | 14.9 | 33.6 | 86.3 |
| 15 | 30.9 | 91.5 | 32.0 | 76.3 | 10.4 | 25.4 | 83.0 |
| 20 | 25.6 | 89.3 | 26.9 | 74.4 | 9.0 | 18.9 | 82.1 |
| 25 | 21.2 | 87.1 | 22.2 | 72.6 | 7.7 | 14.1 | 81.1 |
| 30 | 17.3 | 84.7 | 17.8 | 70.9 | 6.6 | 10.5 | 79.5 |
| 35 | 13.4 | 81.6 | 13.8 | 69.2 | 5.3 | 7.8 | 77.3 |
| 40 | 10.0 | 79.2 | 10.3 | 67.7 | 3.9 | 5.8 | 74.5 |
| 45 | 7.4 | 77.0 | 7.6 | 66.4 | 2.9 | 4.3 | 72.2 |
| 50 | 5.5 | 74.9 | 5.7 | 65.0 | 1.6 | 2.4 | 68.3 |

Also, the following Table 5 shows a measurement result of various characteristics of solar cells (Examples 3D and 3E) in which the respective contact layers 26 were made of GaInP and GaAs. Note that the first electrode was configured only of an ITO layer in comparative example 3.

TABLE 5

| | Unit | Example 3D | Example 3E | Comparative Example 3 |
|---|---|---|---|---|
| Composition of Contact Layer | | GaInP | GaAs | GaInP |
| Thickness of First Electrode | | | | 170 |
| Second Layer | nm | 25 | 25 | |
| First Layer | nm | 5 | 5 | |
| Light Reflectance of First Electrode | % | 3.3 | 2.0 | 15.1 |
| Light Absorptance of First Electrode | % | 1.0 | 1.0 | 18.9 |
| Light Absorptance of Contact Layer | | 0.0 | 0.0 | 0.0 |
| Loss of Entering Light due to Formation of Auxiliary Electrode | % | 1.4 | 1.0 | 0.0 |
| Total Loss of Entering Light | % | 5.7 | 4.0 | 34.0 |
| Conversion Efficiency | % | 25.6 | 26.1 | 18.0 |
| Contact Resistance | $\Omega \cdot cm^2$ | $3 \times 10^{-3}$ | $2 \times 10^{-5}$ | |

Further, a simulation result of a relationship between carrier concentration (impurity concentration) of the contact layer 26 and a conversion efficiency based on AM15D was as shown in the following Table 7. Note that various parameters used in the simulation are as shown in Table 6 below. The simulation result revealed that as the carrier concentration of the contact layer 26 is higher, i.e., electrical resistance of the contact layer 26 is lower, higher conversion efficiency is obtainable. Also, the simulation result was well coincident with actual measurement values.

TABLE 6

Mean Light Absorptance of First Electrode = 1%
Mean Electrical Resistivity of First Electrode = $1.5 \times 10^{-4} \Omega \cdot cm$
Loss of Entering Light due to Formation of Auxiliary Electrode = 5%
Width of Auxiliary Electrode = 5.0 μm
Grid Space = 97 μm

TABLE 6-continued

Reflection Prevention Film = 18 nm Tantalum Oxide/65 nm Silicon Oxide
Light Reflectance = 3.3%

TABLE 7

| Carrier Concentration of Contact Layer | Light Condensing Magnification | |
|---|---|---|
| | At 100-fold | At 1000-fold |
| $2 \times 10^{-3}$ cm$^{-3}$ | 24.3 | — |
| $1 \times 10^{-3}$ cm$^{-3}$ | 25.8 | — |
| $5 \times 10^{-4}$ cm$^{-3}$ | 26.6 | 21.0 |
| $2 \times 10^{-4}$ cm$^{-3}$ | 27.1 | 25.6 |
| $1 \times 10^{-4}$ cm$^{-3}$ | 27.3 | 27.2 |
| $5 \times 10^{-5}$ cm$^{-3}$ | 27.4 | 27.9 |
| $2 \times 10^{-5}$ cm$^{-3}$ | 27.5 | 28.4 |
| $1 \times 10^{-5}$ cm$^{-3}$ | 27.5 | 28.5 |
| $5 \times 10^{-6}$ cm$^{-3}$ | 27.5 | 28.6 |

To prevent reflection of light in the first electrode 30, instead of forming the reflection prevention film, a portion of the second surface 30B of the first electrode 30, exposed between the auxiliary electrodes 40, may be provided with recesses and projections, which may be achieved by attaching microparticles made of ITO to the second surface 30B of the first electrode 30 followed by etching of the second surface 30B of the first electrode 30 that includes the ITO microparticles, for example.

Example 4

Example 4 relates to the light emitting diode (LED) and the surface emitting laser element (vertical cavity surface emitting laser, or VCSEL) of the disclosure. A light emitting diode 14 or a surface emitting laser element 15 in the Example 4 includes:

a light receiving layer 121 or 221 in which the plurality of compound semiconductor layers are stacked; and an electrode (the first electrode 30) having the first surface 30A and the second surface 30B and made of a transparent conductive material, in which the second surface 30B faces the first surface 30A, and the electrode is in contact, at the first surface 30A, with the light emitting layer 121 or 221, wherein the transparent conductive material contains the additive made of one or more metals, or a compound thereof, selected from the group consisting of molybdenum, tungsten, chromium, ruthenium, titanium, nickel, zinc, iron, and copper, and the concentration of the additive contained in the transparent conductive material near an interface to the first surface 30A of the electrode (the first electrode 30) is higher than the concentration of the additive contained in the transparent conductive material near the second surface 30B of the electrode (the first electrode 30).

Figure 3A:
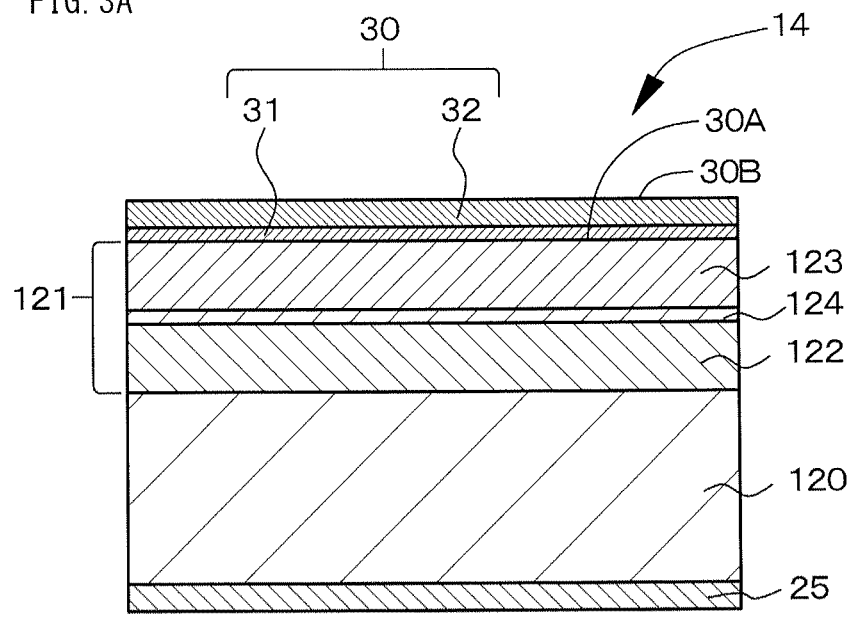
FIGS. 3A and 3B are each a schematic cross-sectional view of a light emitting diode and a surface emitting laser element in Example 4.

Specifically, as illustrated in FIG. 3A as a schematic cross-sectional view, the light emitting diode 14 in the Example 4 includes: the light emitting layer 121 in which a first compound semiconductor layer 122 formed on a substrate 120 and made of AlGaAs, AlGaInP, AlGaN, or GaN, an active layer 124 made of AlGaN, GaInP, GaN, or InGaN, and a second compound semiconductor layer 123 made of AlGaAs, AlGaInP, AlGaN, or GaN are stacked; and the first electrode 30 having a stacked structure formed on the light emitting layer 121 and including the first layer 31 and the second layer 32. In addition, the second electrode 25 is formed on a lower surface of the substrate 120.

Figure 3B:
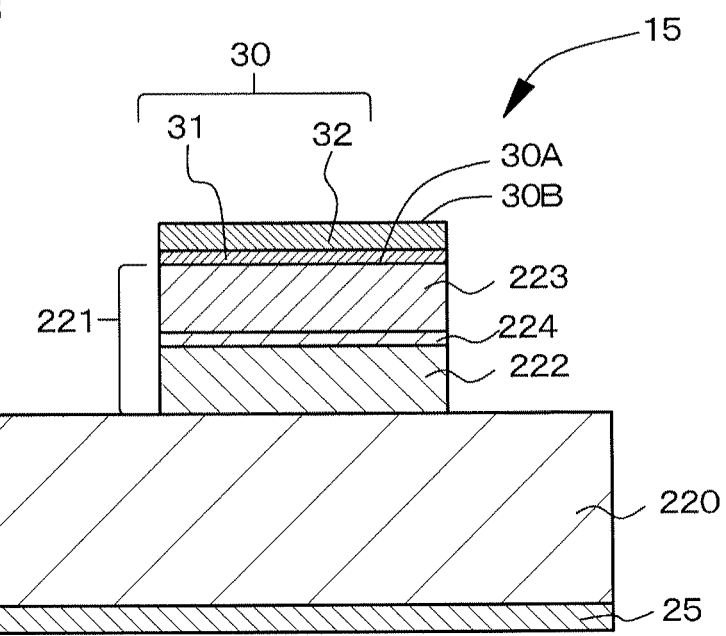

Also, as illustrated in FIG. 3B as a schematic cross-sectional view, the light emitting layer 221, in which the plurality of compound semiconductor layers are stacked, in the surface emitting laser element 15 of the Example 4 includes: a first compound semiconductor layer 222 formed on a substrate 220 configured of an n-type GaAs substrate, an active layer 224, and a second compound semiconductor layer 223. Here, the first compound semiconductor layer 222 has a stacked structure including, from the substrate side: a first DBR (Distributed Bragg Reflector) layer configured of GaAs/AlGaAs, AlGaAs/AlGaAs, or GaAs/AlAs; a current confining layer; and a first cladding layer made of AlGaAs, AlGaInP, or GaInP. Also, the active layer 224 has a multiple quantum well structure made of GaAs, AlGaAs, or GaInP. Further, the second compound semiconductor layer 223 has a stacked structure including, from the substrate side: a second cladding layer configured of GaAs/AlGaAs, AlGaAs/AlGaAs, or GaAs/AlAs; and a second DBR layer made of AlGaAs, AlGaInP, or GaInP. The current confining layer is configured of an insulating region (made of $Al_xO_{1-x}$) formed from a side surface of a mesa structure toward the center of the mesa structure, and a current confining region (made of AlAs or AlGaAs) surrounded by the insulating region. Note that the first compound semiconductor layer 222, the active layer 224, and the second compound semiconductor layer 223 are each illustrated as having one layer in the drawing. The first electrode 30 having the stacked structure including the first layer 31 and the second layer 32 is formed on the light emitting layer 221. In addition, the second electrode 25 is formed on a lower surface of the substrate 220.

In the light emitting diode or the surface emitting laser element of the Example 4 as well, the transparent conductive material configuring the first electrode contains molybdenum (Mo) as the additive. Further, the concentration of the additive contained in the transparent conductive material near the interface to the first surface of the first electrode is higher than the concentration of the additive contained in the transparent conductive material near the second surface of the first electrode. Hence, it is possible to provide the first electrode that satisfies both low contact resistance and high light transmittance.

Example 5

Example 5 is a modification of the Examples 1 to 4, and relates to the light receiving/emitting element, etc., of the disclosure having the second configuration. In the light receiving/emitting element, the solar cell, the optical sensor, the light emitting diode, and the surface emitting laser element of the Example 5, the concentration of the additive contained in the transparent conductive material configuring the first electrode decreases gradually from the first surface to the second surface of the first electrode. As with the Example 1 described above, such a first electrode is formed, specifically, through preparing the sputtering system in which the transparent conductive material target made of the transparent conductive material (ITO) and the additive target made of the additive (Mo) are arranged. Then, first, the sputtering is performed in which the additive target is used to attach the additive to the transparent conductive material target, following which the substrate, formed with the light receiving/emitting layer (light receiving layer) in which the plurality of compound semiconductor layers are stacked, is brought into the sputtering system, and the transparent conductive material target attached with the additive is used to perform sputtering for formation of the first electrode, without performing the so-called pre-sputtering. Thereafter, performing a heat treatment generates a concentration gradient of Mo serving as an impurity in a thickness direction of the first electrode, thus making it possible to achieve a structure in which the concentration of the additive, contained in the transparent conductive material configuring the first electrode, is gradually decreased from the first surface to the second surface of the first electrode. Otherwise, configurations and structures of the respective light receiving/emitting element, solar cell, optical sensor, light emitting diode, and surface emitting laser element in the Example 5 are similar to those of the respective light receiving/emitting element, solar cell, and optical sensor in each of the Examples 1 to 3, or those of the respective light emitting diode and surface emitting laser element in the Example 4; therefore, a detailed description thereof is omitted.

Although the disclosure has been described in the foregoing based on preferred embodiments, the disclosure is not limited to those embodiments. Configuration and structures of the respective light receiving/emitting element, solar cell, optical sensor, light emitting diode, and surface emitting laser element in the embodiments are illustrative, and may be modified on an as-necessary basis. For example, the solar cell may be a multi junction solar cell.

Note that the disclosure may also take the following forms.

[1] <Light receiving/emitting element>

A light receiving/emitting element, including:

a light receiving/emitting layer in which a plurality of compound semiconductor layers are stacked; and an electrode having a first surface and a second surface and made of a transparent conductive material, the second surface facing the first surface, and the electrode being in contact, at the first surface, with the light receiving/emitting layer, wherein the transparent conductive material contains an additive made of one or more metals, or a compound thereof, selected from the group consisting of molybdenum, tungsten, chromium, ruthenium, titanium, nickel, zinc, iron, and copper, and concentration of the additive contained in the transparent conductive material near an interface to the first surface of the electrode is higher than concentration of the additive contained in the transparent conductive material near the second surface of the electrode.

[2] The light receiving/emitting element according to [1], wherein the compound semiconductor layers are each configured of one of: a GaAs-based compound semiconductor including binary mixed crystal, ternary mixed crystal, or quaternary mixed crystal; a GaP-based compound semiconductor including binary mixed crystal, ternary mixed crystal, or quaternary mixed crystal; a GaInP-based compound semiconductor including ternary mixed crystal or quaternary mixed crystal; an InP-based compound semiconductor including binary mixed crystal, ternary mixed crystal, or quaternary mixed crystal; and a GaN-based compound semiconductor including binary mixed crystal, ternary mixed crystal, or quaternary mixed crystal.

[3] The light receiving/emitting element according to [1] or [2], wherein the transparent conductive material is one of ITO, IZO, AZO, GZO, AlMgZnO, IGO, IGZO, IFO, ATO, FTO, $SnO_2$, ZnO, B-doped ZnO, InSnZnO, and ITiO.

[4] The light receiving/emitting element according to any one of [1] to [3], wherein auxiliary electrodes are formed on the second surface of the electrode.

[5] The light receiving/emitting element according to [4], wherein a contact layer is formed between the light receiving/emitting layer and the second surface of the electrode, and the contact layer is configured of a compound semiconductor same as a compound semiconductor that configures one or more layers in the plurality of compound semiconductor layers configuring the light receiving/emitting layer.

[6] The light receiving/emitting element according to [5], wherein a thickness of the contact layer is from 3 nm to 30 nm where band gap energy of a material configuring the contact layer is smaller than band gap energy of the light receiving layer or the light emitting layer.

[7] The light receiving/emitting element according to [5] or [6], wherein carrier concentration of the contact layer is $1\times10^{19}$ $cm^{-3}$ or greater.

[8] The light receiving/emitting element according to any one of [5] to [7], wherein the light receiving/emitting layer has a stacked structure including an n-type compound semiconductor layer and a p-type compound semiconductor layer from contact layer side, and the contact layer is made of one of GaAs, GaInP, GaP, InP, InGaAs, InGaAsP, GaN, and InGaN.

[9] The light receiving/emitting element according to any one of [1] to [8], wherein the electrode has a stacked structure including a first layer and a second layer from light receiving/emitting layer side, the additive is contained in the transparent conductive material configuring the first layer, and no additive is contained in the transparent conductive material configuring the second layer.

[10] The light receiving/emitting element according to [9], wherein mean concentration of the additive contained in the transparent conductive material configuring the first layer is from $5\times10^{16}$ $cm^{-3}$ to $1\times10^{18}$ $cm^{-3}$.

[11] The light receiving/emitting element according to [9] or [10], wherein the following expressions are satisfied:

$0.4 \leq R_2/R_1 \leq 1.0$ $0.8 \leq TP_2 \times TP_1 \leq 1.0$ where electrical resistivity of the first layer is $R_1$, electrical resistivity of the second layer is $R_2$, and light transmittance of the first layer and light transmittance of the second layer are $TP_1$ and $TP_2$, respectively, where a wavelength ranges from 400 nm to 900 nm.

[12] The light receiving/emitting element according to any one of [9] to [11], wherein mean light transmittance of the electrode is 95% or greater, mean electrical resistivity of the electrode is $2\times10^{-6}$ $\Omega\cdot m$ or less, and contact resistance between the electrode and the light receiving/emitting layer is $1\times10^{-8}$ $\Omega\cdot m^2$ or less.

[13] The light receiving/emitting element according to any one of [9] to [12], wherein the following expression is satisfied:

$2 \leq T_2/T_1 \leq 70$ where a thickness of the first layer is $T_1$ and a thickness of the second layer is $T_2$.

[14] The light receiving/emitting element according to [13], wherein the following expressions are satisfied:

$3 \leq T_1$ (nm) $\leq 60$; and $10 \leq T_2$ (nm) $\leq 350$.

[15] The light receiving/emitting element according to any one of [1] to [8], wherein concentration of the additive contained in the transparent conductive material configuring the electrode decreases gradually from the first surface to the second surface of the electrode.

[16] <Solar cell>
A solar cell, including:
a light receiving layer in which a plurality of compound semiconductor layers are stacked; and
an electrode having a first surface and a second surface and made of a transparent conductive material, the second surface facing the first surface, and the electrode being in contact, at the first surface, with the light receiving layer, wherein the transparent conductive material contains an additive made of one or more metals, or a compound thereof, selected from the group consisting of molybdenum, tungsten, chromium, ruthenium, titanium, nickel, zinc, iron, and copper, and concentration of the additive contained in the transparent conductive material near an interface to the first surface of the electrode is higher than concentration of the additive contained in the transparent conductive material near the second surface of the electrode.

[17] The solar cell according to [16], wherein
auxiliary electrodes are formed on the second surface of the electrode,
a contact layer is formed between the light-receiving layer and the first surface of the electrode, and
a reflection prevention film is formed on the exposed second surface of the electrode.

[18] The solar cell according to [17], wherein
a width of a portion of the second surface of the electrode, exposed between the auxiliary electrodes, is from 145 μm to 285 μm,
a thickness of the electrode is from 10 nm to 30 nm, and
the reflection prevention film has a stacked structure including a zinc sulfide layer having a thickness from 17 nm to 36 nm and a magnesium fluoride layer having a thickness from 85 nm to 93 nm.

[19] The solar cell according to [17], wherein
a width of a portion of the second surface of the electrode, exposed between the auxiliary electrodes, is from 145 μm to 285 μm,
a thickness of the electrode is from 10 nm to 30 nm, and
the reflection prevention film has a stacked structure including a tantalum oxide layer having a thickness from 18 nm to 32 nm and a silicon oxide layer having a thickness from 71 nm to 76 nm.

[20] The solar cell according to [17], wherein
a width of a portion of the second surface of the electrode, exposed between the auxiliary electrodes, is from 145 μm to 285 μm,
a thickness of the electrode is from 10 nm to 25 nm, and
the reflection prevention film has a stacked structure including a titanium oxide layer having a thickness from 7 nm to 15 nm, a tantalum oxide layer having a thickness from 14 nm to 34 nm, and a silicon oxide layer having a thickness from 81 nm to 86 nm.

[21] The solar cell according to [16], wherein
auxiliary electrodes are formed on the second surface of the electrode,
a contact layer is formed between the light-receiving layer and the first surface of the electrode, and
a portion of the second surface of the electrode, exposed between the auxiliary electrodes, is provided with recesses and projections.

[22] The solar cell according to any one of [16] to [21], wherein a condenser lens is provided on light entering side.

[23] <Optical sensor>
An optical sensor, including:
a light receiving layer in which a plurality of compound semiconductor layers are stacked; and
an electrode having a first surface and a second surface and made of a transparent conductive material, the second surface facing the first surface, and the electrode being in contact, at the first surface, with the light receiving layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

[24] <Light emitting diode>
A light emitting diode, including:
a light emitting layer in which a plurality of compound semiconductor layers are stacked; and
an electrode having a first surface and a second surface and made of a transparent conductive material, the second surface facing the first surface, and the electrode being in contact, at the first surface, with the light emitting layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

[25] <Surface emitting laser element>
A surface emitting laser element, including:
a light emitting layer in which a plurality of compound semiconductor layers are stacked; and
an electrode having a first surface and a second surface and made of a transparent conductive material, the second surface facing the first surface, and the electrode being in contact, at the first surface, with the light emitting layer,
wherein the transparent conductive material contains an additive made of one or more metals, or a compound thereof, selected from the group consisting of molybdenum, tungsten, chromium, ruthenium, titanium, nickel, zinc, iron, and copper, and
concentration of the additive contained in the transparent conductive material near an interface to the first surface of the electrode is higher than concentration of the additive contained in the transparent conductive material near the second surface of the electrode.

REFERENCE SIGNS LIST 11, 12, 13 . . . light receiving/emitting element, solar cell, or optical sensor, 14 . . . light emitting diode (LED), 15 . . . surface emitting laser element (vertical cavity surface emitting laser or VCSEL), 20, 120, 220 . . . substrate, 21, 121, 221 . . . light receiving/emitting layer (light receiving layer or light emitting layer), 22, 122, 222 . . . first compound semiconductor layer, 23, 123, 223 . . . second compound semiconductor layer (emitter layer), 124, 224 . . . active layer, 24 . . . front surface field layer, 25 . . . second electrode, 26 . . . contact layer, 30, 33 . . . electrode (first electrode), 30A, 33A . . . first surface of electrode (first electrode), 30B, 33B . . . second surface of electrode (first electrode), 31 . . . first layer of electrode (first electrode), 32 . . . second layer of electrode (first electrode), 40 . . . auxiliary electrode, 40A . . . branch auxiliary electrode, 41 . . . reflection prevention film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:
1. A solar cell, comprising:
a light receiving layer in which a plurality of compound semiconductor layers are stacked; and
an electrode having a first surface and a second surface and made of a transparent conductive material, the second surface facing the first surface, and the electrode being in contact, at the first surface, with the light receiving layer,
wherein the transparent conductive material contains an additive including one or more metals, or a compound thereof, selected from the group consisting of molybdenum, tungsten, chromium, ruthenium, titanium, nickel, iron, and copper,
a concentration of the additive contained in the transparent conductive material near an interface to the first surface of the electrode is higher than a concentration of the additive contained in the transparent conductive material near the second surface of the electrode, and
auxiliary electrodes are formed on the second surface of the electrode, a contact layer is formed between the light-receiving layer and the first surface of the electrode, and a portion of the second surface of the electrode, exposed between the auxiliary electrodes, is provided with recesses and projections,
wherein the electrode includes a first layer adjacent to the light receiving layer and a second layer provided on the first layer, and wherein a mean concentration of the additive in the first layer from $5 \times 10^{16}$ cm$^{-3}$ to $1 \times 10^{18}$ cm$^{-3}$.

2. The solar cell according to claim 1, wherein a reflection prevention film is formed on the second surface of the electrode.

3. The solar cell according to claim 2, wherein a width of a portion of the second surface of the electrode, exposed between the auxiliary electrodes, is from 145 μm to 285 μm, a thickness of the electrode is from 10 nm to 30 nm, and the reflection prevention film has a stacked structure including a zinc sulfide layer having a thickness from 17 nm to 36 nm and a magnesium fluoride layer having a thickness from 85 nm to 93 nm.

4. The solar cell according to claim 2, wherein a width of a portion of the second surface of the electrode, exposed between the auxiliary electrodes, is from 145 μm to 285 μm, a thickness of the electrode is from 10 nm to 30 nm, and the reflection prevention film has a stacked structure including a tantalum oxide layer having a thickness from 18 nm to 32 nm and a silicon oxide layer having a thickness from 71 nm to 76 nm.

5. The solar cell according to claim 2, wherein a width of a portion of the second surface of the electrode, exposed between the auxiliary electrodes, is from 145 μm to 285 μm, a thickness of the electrode is from 10 nm to 25 nm, and the reflection prevention film has a stacked structure including a titanium oxide layer having a thickness from 7 nm to 15 nm, a tantalum oxide layer having a thickness from 14 nm to 34 nm, and a silicon oxide layer having a thickness from 81 nm to 86 nm.

* * * * *